(12) United States Patent
Kurosawa et al.

(10) Patent No.: US 7,466,141 B2
(45) Date of Patent: *Dec. 16, 2008

(54) PHASE MEASUREMENT DEVICE, METHOD, PROGRAM, AND RECORDING MEDIUM

(75) Inventors: Makoto Kurosawa, Saitama (JP); Juichi Nakada, Gunma (JP)

(73) Assignee: Advantest Corporation, Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 10/597,415

(22) PCT Filed: Jan. 19, 2005

(86) PCT No.: PCT/JP2005/000933

§ 371 (c)(1),
(2), (4) Date: Oct. 31, 2006

(87) PCT Pub. No.: WO2005/073738

PCT Pub. Date: Aug. 11, 2005

(65) Prior Publication Data

US 2008/0018322 A1      Jan. 24, 2008

(30) Foreign Application Priority Data

Jan. 30, 2004 (JP) .............................. 2004-023378

(51) Int. Cl.
*G01R 23/20* (2006.01)
*G01R 23/16* (2006.01)

(52) U.S. Cl. .................................. 324/622; 324/76.21

(58) Field of Classification Search .............. 324/76.77, 324/76.11, 613, 620, 622, 623, 626, 76.21, 324/76.78; 702/69, 72, 77
See application file for complete search history.

(56) References Cited

U.S. PATENT DOCUMENTS 2,929,987 A * 3/1960 Noland et al. ............... 324/622

(Continued)

FOREIGN PATENT DOCUMENTS

JP      7-229944      8/1995

(Continued)

OTHER PUBLICATIONS

English Language Abstract JP 2002-228694.

(Continued)

*Primary Examiner*—Diego Gutierrez
*Assistant Examiner*—Hoai-An D Nguyen
(74) *Attorney, Agent, or Firm*—Greenblum & Bernstein, P.L.C.

(57) ABSTRACT

A phase measurement device measures an output of an amplifier when an input signal having input frequency components is fed to the amplifier, and includes multipliers for orthogonally transforming the output of the amplifier a phase acquisition section for acquiring phases $\theta 1$ and $\theta 2$ of the input frequency components in the output of the multipliers, and $\theta 3$ and $\theta 4$ (third distortion), and $\theta 5$ and $\theta 6$ (fifth distortion) of the distortion components, a match time/phase measurement section for measuring a match time point $\Delta t$ when $\theta 1$ and $\theta 2$ match each other and a distortion component phase measurement section for measuring phases $\theta 3$ to $\theta 6$ at the match time point $\Delta t$. The phase acquisition section acquires at least one of $\theta 1$ and $\theta 2$, and $\theta 3$ and $\theta 5$ (with the frequencies higher than those of $\theta 1$ and $\theta 2$) or $\theta 4$ and $\theta 6$ (with the frequencies lower than those of $\theta 1$ and $\theta 2$).

19 Claims, 16 Drawing Sheets

U.S. PATENT DOCUMENTS

| | | | | |
|---|---|---|---|---|
| 5,218,289 | A | * | 6/1993 | Besson ..................... 324/76.78 |
| 5,376,848 | A | * | 12/1994 | Hanke et al. ................. 327/141 |
| 5,649,304 | A | * | 7/1997 | Cabot ....................... 455/67.14 |
| 7,323,883 | B2 | * | 1/2008 | Nakada ....................... 324/622 |

FOREIGN PATENT DOCUMENTS

| | | |
|---|---|---|
| JP | 2000-314753 | 11/2000 |
| JP | 2001-285211 | 10/2001 |
| JP | 2002-228694 | 8/2002 |

OTHER PUBLICATIONS

English Language Abstract JP 2000-314753.
English Language Abstract JP 7-229944.
English Language Abstract JP 2001-285211.
U.S. Appl. No. 10/556,352 to Maruyama et al., filed Nov. 10, 2005.
U.S. Appl. No. 10/556,354 to Takaoku, filed Nov. 10, 2005.
U.S. Appl. No. 10/557,596 to Nakada, filed Nov. 22, 2005.
U.S. Appl. No. 10/597,451 to Miyauchi et al., filed Jul. 26, 2006.
U.S. Appl. No. 10/577,254 to Nowara, filed Apr. 26, 2006.

* cited by examiner (a)

(b)

PHASE MEASUREMENT DEVICE, METHOD, PROGRAM, AND RECORDING MEDIUM

TECHNICAL FIELD

The present invention relates to a measurement of a phase of a distortion of a signal output from a non-linear circuit (circuit to be measured) upon a signal having at least two frequency components is fed to the non-linear circuit.

BACKGROUND ART

It has conventionally been a general practice to amplify a signal by feeding the signal to an amplifier. It is ideal that the amplifier is a linear circuit. However, it is difficult to manufacture an amplifier which is a completely linear circuit, and an amplifier is thus treated as a type of a non-linear circuit. Namely, if a signal is fed to an amplifier, distortion components in addition to an amplified signal is output.

A measurement of such distortion components has been practiced as described in Patent Document 1 (Japanese Laid-Open Patent Publication (Kokai) No. 2001-285211 (ABSTRACT)), for example.

However, a measurement of the phases of distortion components output from an amplifier has not been practiced conventionally upon a signal having at least two frequency components being fed to the amplifier.

An object of the present invention is to measure the phases of distortions of a signal output from a circuit to be measured upon a signal having at least two frequency components is fed to the circuit to be measured.

DISCLOSURE OF THE INVENTION

According to an aspect of the present invention, a phase measurement device that measures an output from a circuit to be measured upon feeding an input signal having at least two input frequency components to the circuit to be measured, includes: a phase acquisition section that acquires phases of the input frequency components and a distortion component based upon a local frequency; a match time measurement unit that measures a match time at which the phases of the input frequency components match each other based upon an acquired result of the phase acquisition section; and a distortion component phase measurement unit that measures a phase of the distortion component at the match time based upon an acquired result of the phase acquisition section, wherein the distortion component includes at least either of a high frequency distortion component that has a frequency higher than the input frequency components, and a low frequency distortion component that has a frequency lower than the input frequency components, and the phase acquisition section acquires both or either of a highest frequency component and a lowest frequency component of the input frequency components, and a phase of the high frequency distortion component or the low frequency distortion component.

According to the thus constructed invention, a phase measurement device that measures an output from a circuit to be measured upon feeding an input signal having at least two input frequency components to the circuit to be measured, is provided.

A phase acquisition section acquires phases of the input frequency components and a distortion component based upon a local frequency. A match time measurement unit measures a match time at which the phases of the input frequency components match each other based upon an acquired result of the phase acquisition section. A distortion component phase measurement unit measures a phase of the distortion component at the match time based upon an acquired result of the phase acquisition section. The distortion component includes at least either of a high frequency distortion component that has a frequency higher than the input frequency components, and a low frequency distortion component that has a frequency lower than the input frequency components. The phase acquisition section acquires both or either of a highest frequency component and a lowest frequency component of the input frequency components, and a phase of the high frequency distortion component or the low frequency distortion component.

According to the present invention, it is preferable that the phase acquisition section includes: an orthogonal transformation unit that orthogonally transforms the output from the circuit to be measured by means of the local frequency; and a phase acquisition unit that acquires the phases of the input frequency components and the distortion component in outputs from the orthogonal transformation unit.

According to the present invention, it is preferable that the phase acquisition section acquires (1) the phases of the highest frequency component and the lowest frequency component of the input frequency components, and the phase of the low frequency distortion component, and (2) the phases of the highest frequency component and the lowest frequency component of the input frequency components, and the phase of the high frequency distortion component.

According to the present invention, it is preferable that the phase measurement device includes a local frequency setting unit that sets the local frequency, wherein the local frequency setting unit sets the local frequency both (3) to an average of the lowest frequency of the distortion components and the highest frequency of the input frequency components, and (4) to an average of the highest frequency of the distortion components and the lowest frequency of the input frequency components.

According to the present invention, it is preferable that the phase acquisition section acquires (5) the phase of the lowest frequency component of the input frequency components and the phase of the highest frequency component of the input frequency components, and (6) the phase of the lowest frequency component of the input frequency components and the phase of the low frequency distortion component, and (7) the phase of the highest frequency component of the input frequency components and the phase of the high frequency distortion component.

According to the present invention, it is preferable that the phase measurement device includes a local frequency setting unit that sets the local frequency, wherein the local frequency setting unit sets the local frequency to an average of the lowest frequency and the highest frequency of the input frequency components, (8) to an average of the lowest frequency of the distortion component and the lowest frequency of the input frequency component, and (9) to an average of the highest frequency of the distortion component and the highest frequency of the input frequency component.

According to the present invention, it is preferable that the phase measurement device includes: a phase change quantity acquisition unit that acquires a phase change quantity of the highest frequency component or the lowest frequency component of the input frequency components which has changed due to a change of the components for which the phase acquisition section acquires the phases each time of the change; and a distortion component phase compensation unit that corrects the measurement result of the distortion component phase measurement unit based upon the phase change quantity.

According to the present invention, it is preferable that the phase acquisition section acquires (10) the phases of the highest frequency component and the lowest frequency component of the input frequency components, and (11) the lowest frequency component of the input frequency components and the phase of a neighboring low frequency distortion component which is a part of the low frequency distortion components, and acquires the phase of a low frequency distortion component whose phase has already been acquired and the phase of a low frequency distortion component whose frequency is lower than that of the low frequency distortion component until the acquisition of the phase of the distortion component at the lowest frequency.

According to the present invention, it is preferable that the phase acquisition section acquires (12) the phases of the highest frequency component and the lowest frequency component of the input frequency components, and (13) the phases of the highest frequency component and the phase of a neighboring high frequency distortion component which is a part of the high frequency distortion components, and acquires the phase of a high frequency distortion component whose phase has already been acquired and the phase of a high frequency distortion component whose frequency is higher than that of the high frequency distortion component until the acquisition of the phase of the distortion component at the highest frequency.

According to the present invention, it is preferable that the phase measurement device includes a local frequency setting unit that sets the local frequency, wherein, upon the phase acquisition, the local frequency setting unit sets the local frequency to an average value of the maximum value and the minimum value of the frequency of the signals for which the phases are acquired.

According to the present invention, it is preferable that the phase measurement device includes: a phase change quantity acquisition unit that acquires a phase change quantity of a distortion component which has changed due to a change of the components for which the phase acquisition section acquires the phases each time of the change; and a distortion component phase compensation unit that corrects the measurement result of the distortion component phase measurement unit based upon the phase change quantity.

According to the present invention, it is preferable that the phase acquisition section includes a discrete Fourier transform unit that carries out discrete Fourier transform.

According to the present invention, it is preferable that the phase measurement device includes a display unit that displays a vector whose angle is the phase of the distortion component, and whose length is the amplitude of the distortion component.

According to the present invention, it is preferable that the display unit displays a vector whose length is a logarithm of the amplitude of the distortion component.

According to another aspect of the present invention, a phase measurement method of measuring an output from a circuit to be measured upon feeding an input signal having at least two input frequency components to the circuit to be measured, includes: a phase acquisition step of acquiring phases of the input frequency components and a distortion component based upon a local frequency; a match time measurement step of measuring a match time at which the phases of the input frequency components match each other based upon an acquired result of the phase acquisition step; and a distortion component phase measurement step of measuring a phase of the distortion component at the match time based upon an acquired result of the phase acquisition step, wherein the distortion component includes at least either of a high frequency distortion component that has a frequency higher than the input frequency components, and a low frequency distortion component that has a frequency lower than the input frequency components, and the phase acquisition step acquires both or either of a highest frequency component and a lowest frequency component of the input frequency components, and a phase of the high frequency distortion component or the low frequency distortion component.

Another aspect of the present invention is a program of instructions for execution by the computer to perform a phase measurement process of a phase measurement device that measures an output from a circuit to be measured upon feeding an input signal having at least two input frequency components to the circuit to be measured, having a phase acquisition section that acquires phases of the input frequency components and a distortion component based upon a local frequency, the phase measurement process including: a match time measurement step of measuring a match time at which the phases of the input frequency components match each other based upon an acquired result of the phase acquisition section; and a distortion component phase measurement step of measuring a phase of the distortion component at the match time based upon an acquired result of the phase acquisition section, wherein the distortion component includes at least either of a high frequency distortion component that has a frequency higher than the input frequency components, and a low frequency distortion component that has a frequency lower than the input frequency components, and the phase acquisition section acquires both or either of a highest frequency component and a lowest frequency component of the input frequency components, and a phase of the high frequency distortion component or the low frequency distortion component.

Another aspect of the present invention is a computer-readable medium having a program of instructions for execution by the computer to perform a phase measurement process of a phase measurement device that measures an output from a circuit to be measured upon feeding an input signal having at least two input frequency components to the circuit to be measured, having a phase acquisition section that acquires phases of the input frequency components and a distortion component based upon a local frequency, the phase measurement process including: a match time measurement step of measuring a match time at which the phases of the input frequency components match each other based upon an acquired result of the phase acquisition section; and a distortion component phase measurement step of measuring a phase of the distortion component at the match time based upon an acquired result of the phase acquisition section, wherein the distortion component includes at least either of a high frequency distortion component that has a frequency higher than the input frequency components, and a low frequency distortion component that has a frequency lower than the input frequency components, and the phase acquisition section acquires both or either of a highest frequency component and a lowest frequency component of the input frequency components, and a phase of the high frequency distortion component or the low frequency distortion component.

BRIEF DESCRIPTION OF THE DRAWINGS

FIG. 2 is a diagram showing an operation of an amplifier 20, wherein FIG. 2(a) shows a frequency spectrum of an input signal fed to the amplifier 20, FIG. 2(b) shows a frequency spectrum of an output from the amplifier 20, and FIG. 2(c) shows a frequency spectrum of an output from the amplifier 20 in a case where $\omega 0$ ($=(\omega 10+\omega 20)/2$) is set to 0;

BEST MODE FOR CARRYING OUT THE INVENTION

A description will now be given of embodiments of the present invention with reference to drawings.

First Embodiment

Figure 1:
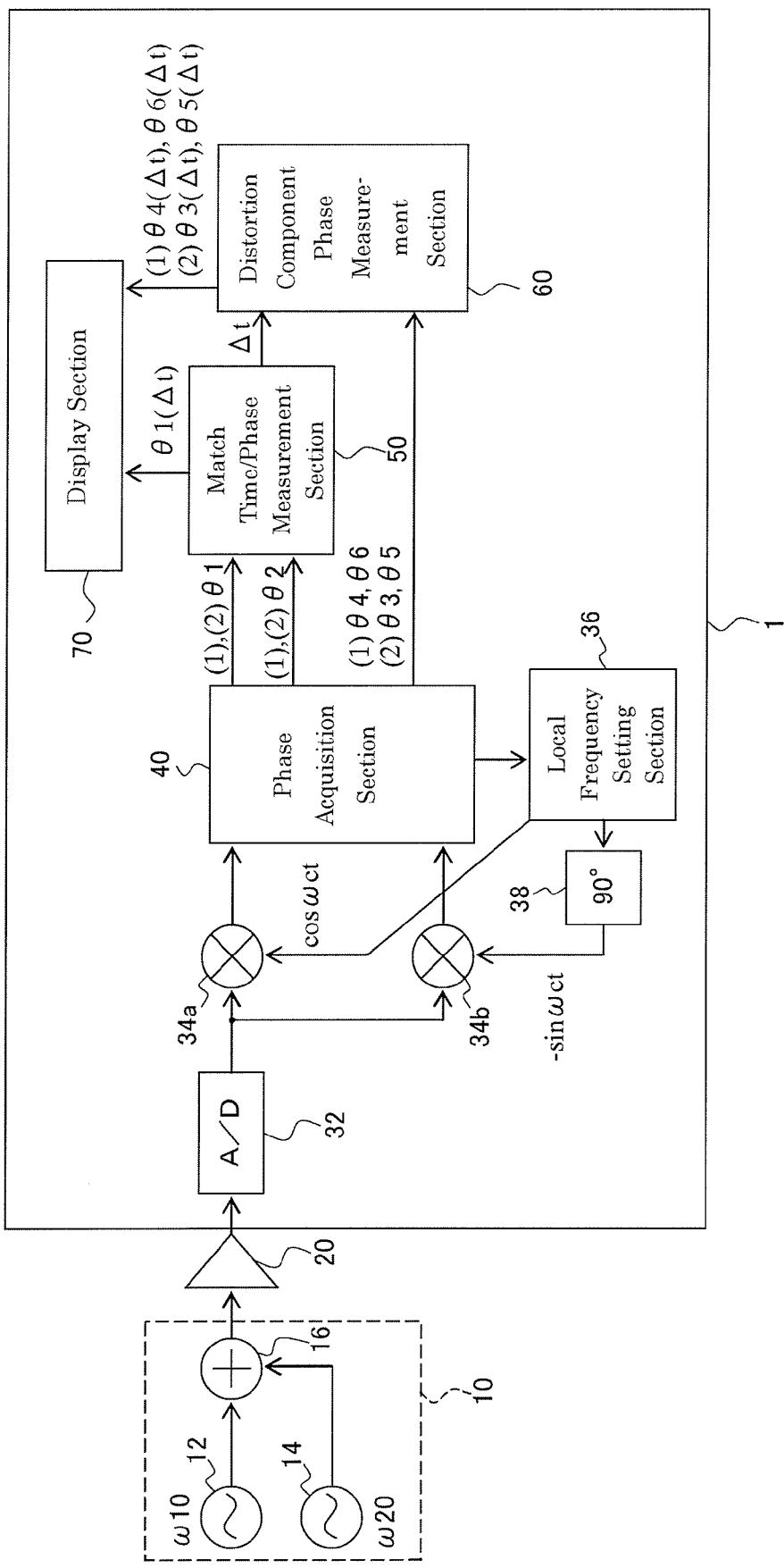
FIG. 1 is a block diagram showing a configuration of an amplifier measurement system according to a first embodiment of the present invention.

FIG. 1 is a block diagram showing a configuration of an amplifier measurement system according to a first embodiment of the present invention. The amplifier measurement system includes an input signal generation section 10, an amplifier (circuit to be measured) 20, an A/D converter 32, multipliers 34a and 34b, a local frequency setting section 36, a 90-degree phase shifter 38, a phase acquisition section 40, a match time/phase measurement section 50, a distortion component phase measurement section 60, and a display section 70.

The input signal generation section 10 generates an input signal having two input frequency components $\omega 1$ and $\omega 2$. The input signal generation section 10 includes a first oscillator 12, a second oscillator 14, and an adder 16. The first oscillator 12 generates a signal of the frequency $\omega 10$. The second oscillator 14 generates a signal of the frequency $\omega 20$. The adder 16 adds the signal of the frequency $\omega 10$ and the signal of the frequency $\omega 20$ to each other, and outputs a result of the addition. An output from the adder 16 is an input signal. The input signal is fed to the amplifier 20.

Figure 2:
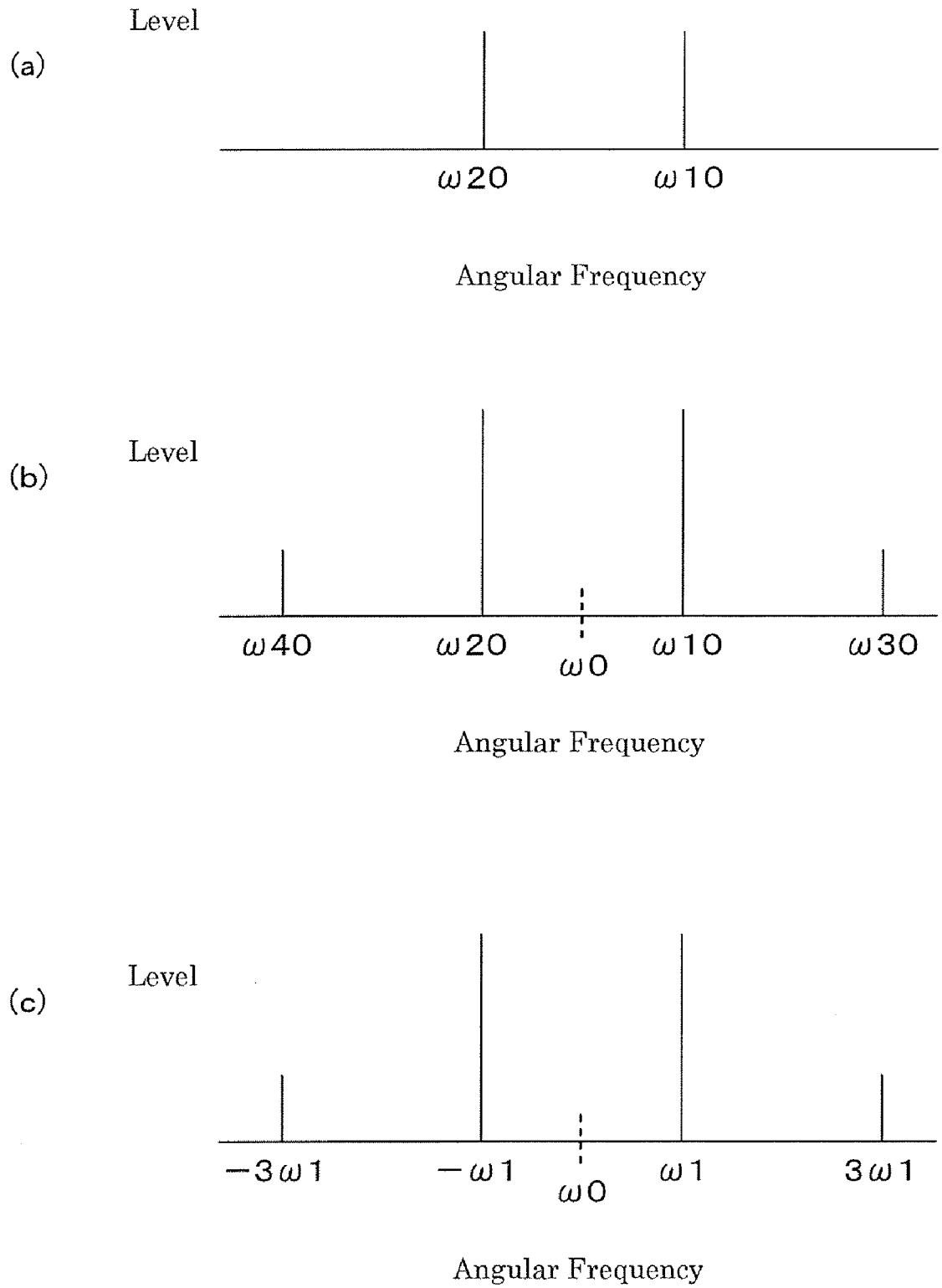

The amplifier (circuit to be measured) 20 amplifies the fed input signal, and outputs a result of the amplification. A description will now be given of an operation of the amplifier 20 with reference to FIG. 2. The frequency spectrum of the input signal fed to the amplifier 20 includes the components of the frequency $\omega 10$ and the frequency $\omega 20$ as shown in FIG. 2(a). The amplifier 20 amplifies the input signal, and outputs the result of the amplification.

The frequency spectrum of the output from the amplifier 20 is as shown in FIG. 2(b). It is recognized that levels of the components of the frequency $\omega 10$ and the frequency $\omega 20$ increase. However, it is difficult to manufacture the amplifier 20 as a completely linear circuit, and the amplifier 20 is thus a non-linear circuit. As a result, there are output components (referred to as distortion components) of a frequency $\theta 30$ and a frequency $\omega 40$ in addition to the components of the frequencies $\omega 10$ and $\omega 20$.

On this occasion, if a frequency $\omega 0$ which is an average of the frequency $\omega 10$ and the frequency $\omega 20$ ($=(\omega 10+\omega 20)/2$) is set to 0, the frequency spectrum of the output from the amplifier 20 is as shown in FIG. 2(c). Namely, $\omega 10$ is equal to $\omega 1$ ($=\omega 10-\omega 0$); $\omega 20$ is equal to $-\omega 1$ ($=\omega 20-\omega 0$); $\omega 30$ is equal to $3\omega 1$ ($=\omega 30-\omega 0$); and $\omega 40$ is equal to $-3\omega 1$ ($=\omega 40-\omega 0$). Since $\omega 1>-\omega 1$, $\omega 1$ is the highest frequency component of input frequency components, and $-\omega 1$ is the lowest frequency component of the input frequency components.

The components of $3\omega 1$ and $-3\omega 1$ are referred to as third distortion components. Distortion components are not limited to the third ones, and there exist fifth distortion components ($5\omega 1$ and $-5\omega 1$), seventh distortion components ($7\omega 1$ and $-7\omega 1$), and distortion components of higher orders.

The phase measurement device 1 includes the A/D converter 32, the multipliers 34a and 34b, the local frequency setting section 36, the 90-degree phase shifter 38, the phase acquisition section 40, the match time/phase measurement section 50, the distortion component phase measurement section 60, and the display section 70.

The A/D converter 32 converts an output from the amplifier 20 into a digital signal. It should be noted that a frequency band to which the A/D converter 32 can adapt is BW.

The multiplier 34a multiplies an output from the A/D converter 32 by $\cos(\omega c \cdot t)$ output from the local frequency setting section 36, and outputs the product. The multiplier 34b multiplies the output from the A/D converter 32 by $-\sin(\omega c \cdot t)$ output from the 90-degree phase shifter 38, and outputs the product. The multipliers 34a and 34b carry out the orthogonal transformation by means of the frequency $\omega c$.

Figure 3:
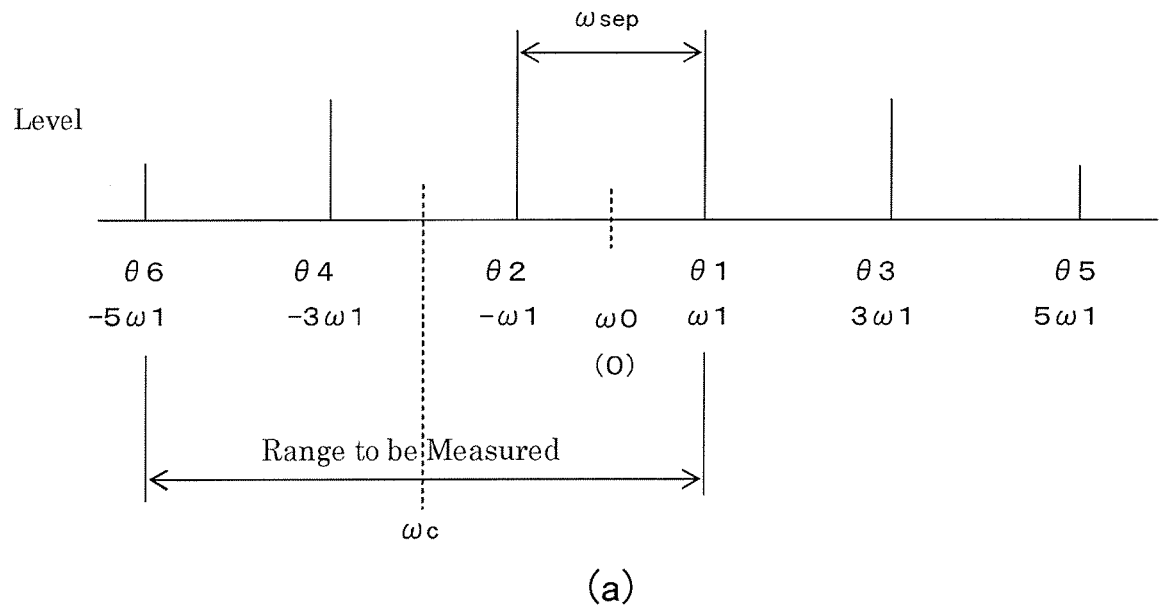
FIG. 3 shows a method to set the local frequency $\omega c$ according to the first embodiment of the present invention.
Figure 3:
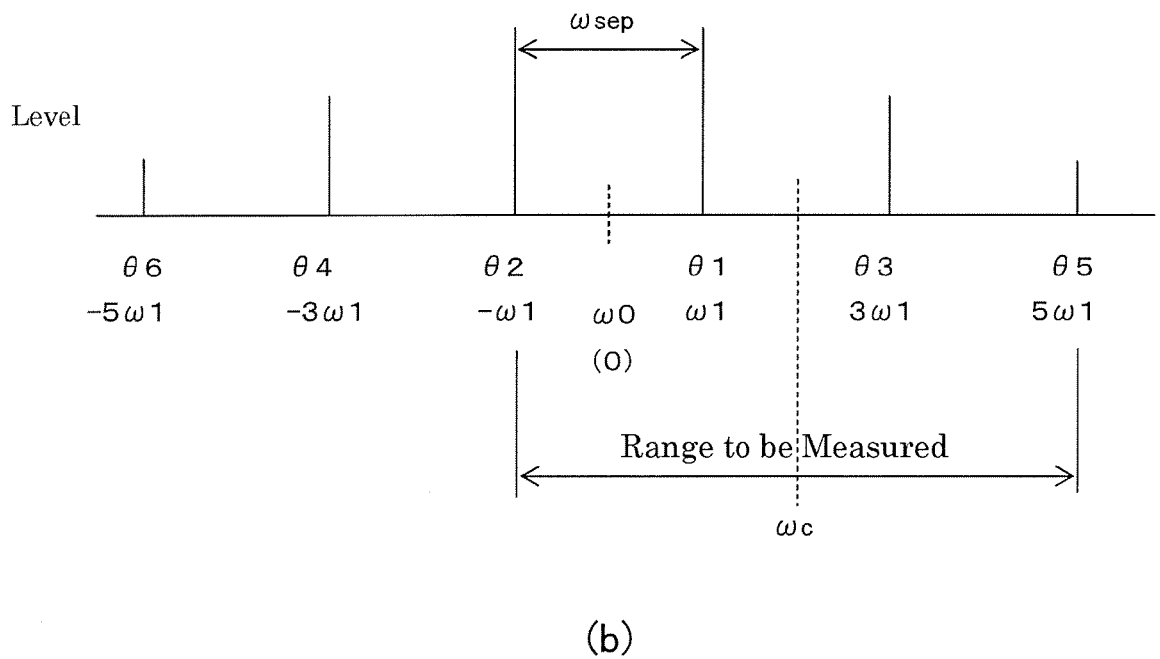

The local frequency setting section 36 sets the local frequency $\omega c$ for the orthogonal transformation. FIG. 3 shows a method to set the local frequency $\omega c$. In FIG. 3, it is assumed to measure the phase of signals within a range of frequency $-5\omega 1$ to $5\omega 1$. Thus, the highest frequency of the distortion components is $5\omega 1$, and the lowest frequency thereof is $-5\omega 1$. It should be noted that $\omega 1-(-\omega 1)=2\omega 1=\omega$sep. First, as shown in FIG. 3(a), the local frequency $\omega c=\omega 0-\omega$sep. If $\omega 0=0$, there holds $\omega c=(\omega 1+(\omega 1+(-5\omega 1)))/2=-2\omega 1$. Then, as shown in FIG. 3(b), the local frequency $\omega c=\omega 0+\omega$sep. If $\omega 0=0$, there holds $\omega c=((-\omega 1)+5\omega 1)/2=2\omega 1$.

The 90-degree phase shifter 38 shifts the phase of an output from the local frequency setting section 36 by 90 degrees, and outputs the result of the shift.

Figure 4:
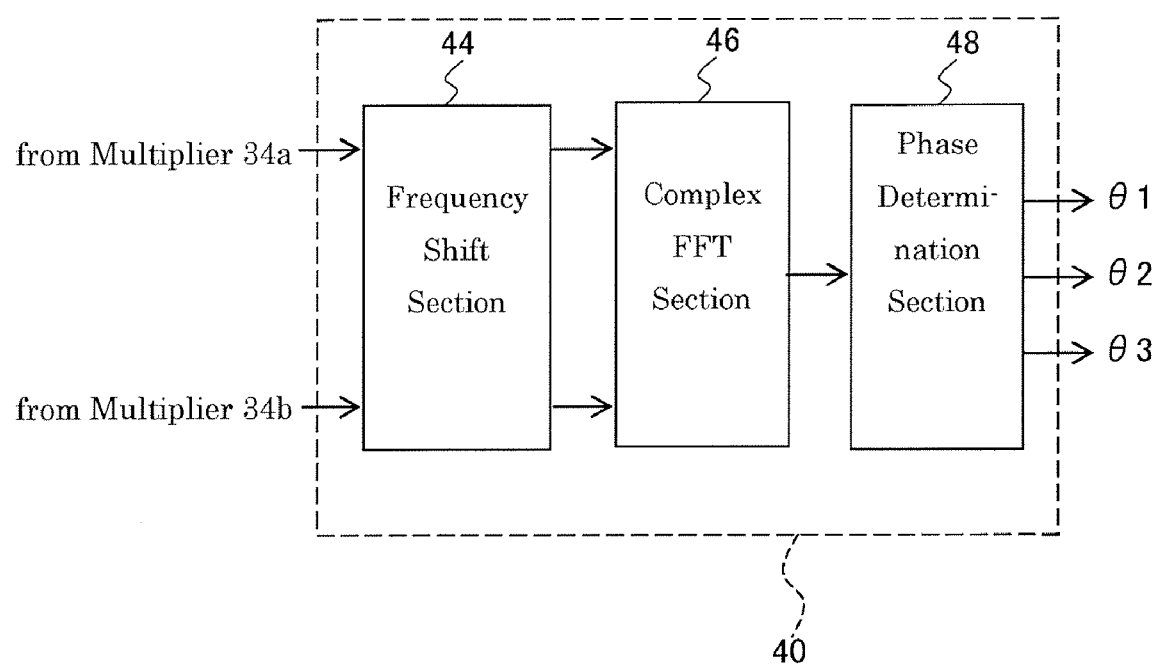
FIG. 4 is a block diagram showing a configuration of a phase acquisition section 40 according to the first embodiment of the present invention.

The phase acquisition section 40 acquires the phases of the input frequency components ($\pm\omega 1$) and the distortion components (such as +3ω1) in the outputs from the multipliers 34a and 34b. FIG. 4 is a block diagram showing a configuration of the phase acquisition section 40. The phase acquisition section 40 includes a frequency shift section 44, a complex FFT (Fast Fourier Transform) section 46, and a phase determination section 48.

The frequency shift section 44 shifts the frequency of the outputs from the multipliers 34a and 34b by ωc−ω0. For example, if the local frequency is ωc=ω0−ωsep (refer to FIG. 3(a)), the frequency is shifted by ωc−ω0=−ωsep, and if the local frequency ωc=ω0+ωsep (refer to FIG. 3(b)), the frequency is shifted by ωc−ω0=ωsep.

Moreover, with reference to FIG. 3(b), the input frequency component (−ω1) is treated as the frequency −1.5ωsep with ωc as an origin in the outputs from the multipliers 34a and 34b. The input frequency component (+ω1) is treated as the frequency −0.5ωsep with ωc as the origin in the outputs from the multipliers 34a and 34b. The distortion component (+3ω1) is treated as the frequency 0.5ωsep with ωc as the origin in the outputs from the multipliers 34a and 34b.

However, as described later, in the first embodiment (the same applied to other embodiments), the angular velocity of the input frequency component (−ω1) and the angular velocity of the input frequency component (+ω1) have the same magnitude (but have different in positive/negative signs), and the angular velocity of the distortion component (+3ω1) should be three times as large as that of the input frequency component (+ω1).

The origin is thus moved from ωc (=ω0+ωsep) to ω0. As a result, the frequency of the outputs from the multipliers 34a and 34b are increased by ωsep by the frequency shift section 44. For example, the input frequency component (−ω1) will have the frequency −1.5ωsep+ωsep=−0.5ωsep. The input frequency component (+ω1) will have the frequency −0.5ωsep+ωsep=0.5ωsep. The distortion component (+3ω1) will have the frequency 0.5ωsep+ωsep=1.5ωsep.

Consequently, the angular velocity of the input frequency component (−ω1) and the angular velocity of the input frequency component (+ω1) have the same magnitude (but have different in positive/negative signs), and the angular velocity of the distortion component (+3ω1) is three times as large as that of the input frequency component (+ω1).

The complex FFT (Fast Fourier Transform) section 46 applies the complex fast Fourier transform to the outputs from the frequency shift section 44. As a result, complex vectors are acquired for the input frequency components (+ω1) and the distortion components (such as +3ω1). It should be noted that the complex FFT section 46 preferably carries out the discrete Fourier transform (DFT). Namely, the discrete Fourier transform (DFT) is applied to ±ω1, ±3ω1, ±5ω1, . . . .

Since there can be selected an arbitrary number of points as calculation points of the discrete Fourier transform, it is possible to carry out the calculation by means of N which satisfies such a relationship as a desired frequency f=fs/N×k (fs: sampling frequency of the A/D converter 32, N: DFT calculation point number, and k: natural number) resulting in calculation with no influence of noises of nearby frequency components without changing the sampling frequency.

The phase determination section 48 determines the phases of the respective components based upon the complex vectors of the input frequency components (+ω1) and the distortion component (such as +3ω1). The phase can be calculated as $\tan^{-1}$ (imaginary part of complex vector/real part of complex vector). It is assumed that the phase of the input frequency component +ω1 is θ1, the phase of the input frequency component −ω1 is θ2, the phase of the distortion component +3ω1 is θ3, the phase of the distortion component −3ω1 is θ4, the phase of the distortion component +5ω1 is θ5, and the phase of the distortion component −5ω1 is θ6 (refer to FIG. 3). θ1, θ2, θ3, . . . are functions of time. In the following section, a phase at time t is denoted as θ1(t), for example.

It should be noted that θ1 is the phase of the highest frequency component of the input frequency components, and θ2 is the phase of the lowest frequency component of the input frequency components. Moreover, θ3 and θ5 are phases of high frequency distortion components whose frequency is higher than those of the input frequency components among the distortion components. Further, θ4 and θ6 are phases of low frequency distortion components whose frequency is lower than those of the input frequency components among the distortion components.

The phase determination section 48 determines θ1, θ2, θ4, and θ6 with reference to FIG. 3(a) (refer to (1) in FIG. 1). On this occasion, the local frequency ωc set by the local frequency setting section 36 is ω0−ωsep.

In this case, it is necessary to measure across a bandwidth from −5ω1 to +ω1 with the local frequency ωc as the center. Therefore, the frequency bandwidth BW to which the A/D converter 32 can adapt is to be BW>+ω1−(−5ω1)= 6ω1=3ωsep.

The phase determination section 48 then determines θ1, θ2, θ3, and θ5 with reference to FIG. 3(b) (refer to (2) in FIG. 1). On this occasion, the local frequency ωc set by the local frequency setting section 36 is ω0+ωsep.

In this case, it is necessary to measure across a bandwidth −ω1 to +5ω1 with the local frequency ωc as the center. Therefore, the frequency bandwidth BW to which the A/D converter 32 can adapt is to be BW>+5ω1−(−ω1)= 6ω1=3ωsep.

It should be noted that when θ1, θ2, θ3, θ4, θ5, and θ6 are measured at the same time, it is necessary to measure across a bandwidth from −5ω1 to +5ω1. Therefore, the frequency bandwidth BW to which the A/D converter 32 can adapt is to be BW>+5ω1−(−5ω1)=10ω1=5ωsep.

Consequently, if θ1, θ2, θ4, and θ6 are determined, and θ1, θ2, θ3, and θ5 are then determined as in the first embodiment, since it is necessary that BW>3ωsep, ωsep can be larger if BW is constant.

With reference again to FIG. 1, the match time/phase measurement section 50 measures a match time point Δt when the phase θ1 of the input frequency component +ω1 and the phase θ2 of the input frequency component −ω1 match each other for the first time, and the phase θ1(Δt) (=θ2(Δt)) thereat based upon the acquisition result of the phase acquisition section 40.

A complex vector s1 of the input frequency component +ω1, and a complex vector s2 of the input frequency component −ω1 are represented by the following equations.

$$s1 = A1 \times e^{j(\omega 1 \times t + \theta 1(0))}$$

$$s2 = A2 \times e^{j(-\omega 1 \times t + \theta 2(0))} \quad \text{[EQU. 1]}$$

Figure 5:
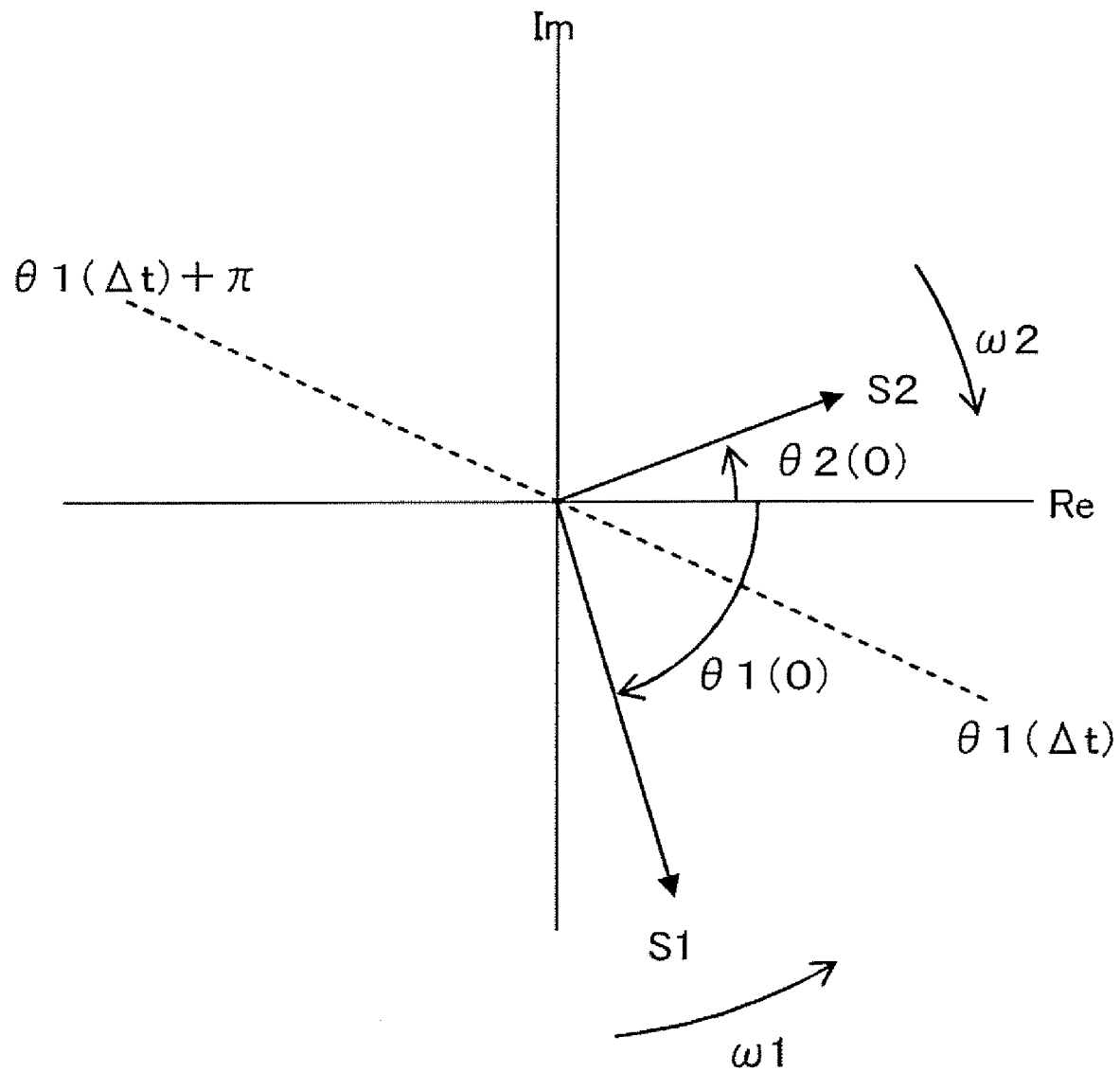
FIG. 5 is a diagram showing initial states (states at time t=0) of complex vectors s1 and s2 according to the first embodiment of the present invention.

As the above equations clearly show, although the complex vectors s1 and s2 are different in length, they rotate at the same rotation speed in directions opposite to each other. In FIG. 5 are shown initial states (states at time t=0) of the complex vectors s1 and s2. In FIG. 5, Im (imaginary part) is assigned to the vertical axis, and Re (real part) is assigned to the horizontal axis. An initial phase of the complex vector s1 is θ1(0), and an initial phase of the complex vector s2 is θ2(0). The phases of the complex vectors s1 and s2 match each other at the time point Δt for the first time. On this occasion, the phase θ1(Δt) (=θ2(Δt)) is expressed by the following equation.

$$\frac{-\theta 1(0) + \theta 2(0)}{2} + \theta 1(0) = \theta 1(\Delta t) \quad \text{[EQU. 2]}$$

Since the complex vectors s1 and s2, whose phases become θ1(Δt) at the time point Δt, rotate at the same rotational speed in the directions opposite to each other, the phases of the complex vectors s1 and s2 match each other at θ1(Δt)+π when they rotate by ½ turn. The time point is Δt+π/ω1 on this occasion. The phases then match each other at θ1(Δt) again. The time point is Δt+2π/ω1 on this occasion. In this way, the phases match each other at time point Δt+n·π/ω1 (n=0, 1, 2, . . . ) and the phases of the complex vectors s1 and s2 on this occasion are θ1(Δt) (n=0, 2, 4, . . . ) or θ1(Δt)+π (n=1, 3, 5, . . . ).

Figure 6:
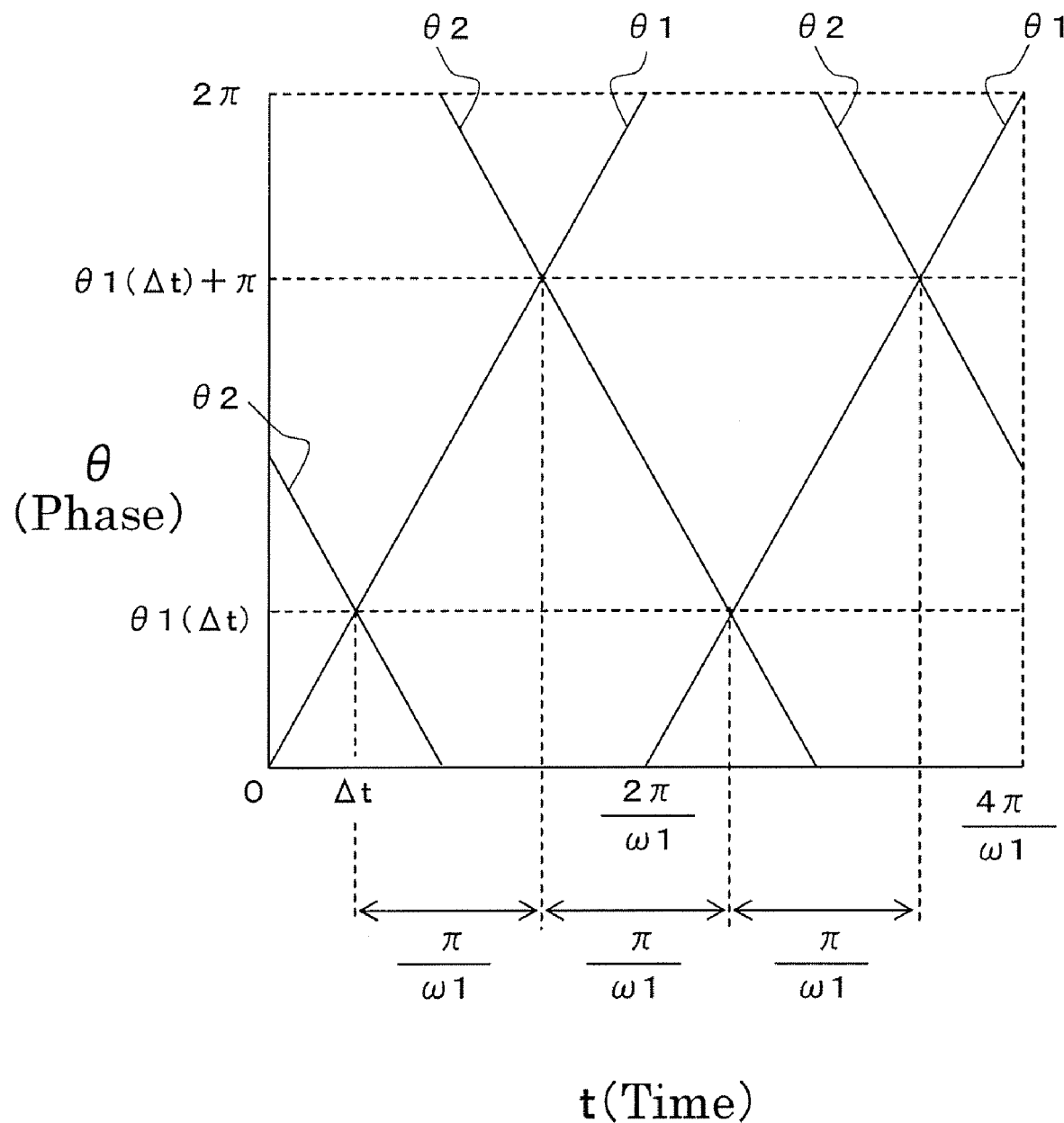
FIG. 6 is a chart showing relationships between the phase $\theta 1$ of the complex vector s1, the phase $\theta 2$ of the complex vector s2, and the time "t" according to the first embodiment of the present invention.

FIG. 6 shows relationships between the phase θ1 of the complex vector s1, the phase θ2 of the complex vector s2, and the time "t" as a chart. It should be noted that θ1(0)=0 for the sake of the illustration. As clearly shown in FIG. 6, the phases of the complex vectors s1 and s2 match each other at time point Δt+n·π/ω1 (n=0, 1, 2, . . . ) and the phases of the complex vectors s1 and s2 on this occasion are θ1(Δt) (n=0, 2, 4, . . . ) or θ1(Δt)+π (n=1, 3, 5, . . . ).

The distortion component phase measurement section 60 measures the phase θ3(Δt) of the distortion component +3ω1 at the match time point Δt based upon the acquisition result of the phase acquisition section 40. The match time point Δt is acquired from the match time/phase measurement section 50. It should be noted that the phases θ4, θ5, and θ6 of other distortion components (such as −3ω1 and ±5ω1) are acquired similarly. A description will now be given of a method to measure the distortion phase with the phase θ3 (Δt) as an example. Other distortion phases are measured by means of the same method.

A complex vector s3 of the distortion component +3ω1 is represented by the following equation.

$$s3 = A3 \times e^{j(3\omega 1 \times t + \theta 3(0))} \quad \text{[EQU. 3]}$$

As the above equation clearly shows, the complex vector s3 rotates three turns while the complex vector s1 rotates one turn. If the complex vector s1 rotates ½ turn, the complex vector s3 rotates 3/2 turn.

As a result, if the complex vector s1 rotates one turn from the phase θ1(Δt), since the complex vector s3 rotates three turns, the phase of the complex vector s3 returns to the initial phase. Thus, if the complex vector s1 rotates "n" turns from the phase θ1(Δt) (n=1, 2, . . . ), the phase of the complex vector s3 returns to the phase θ3(Δt) of the distortion component +3ω1 at the match time point Δt.

Moreover, if the complex vector s1 rotates ½ turn from the phase θ1(Δt), since the complex vector s3 rotates 3/2 turns, the phase of the complex vector s3 advances by π. As a result, if the phase of the complex vector s1 becomes θ1(Δt)+π, the phase of the complex vector s3 becomes θ3(Δt)+π.

Figure 7:
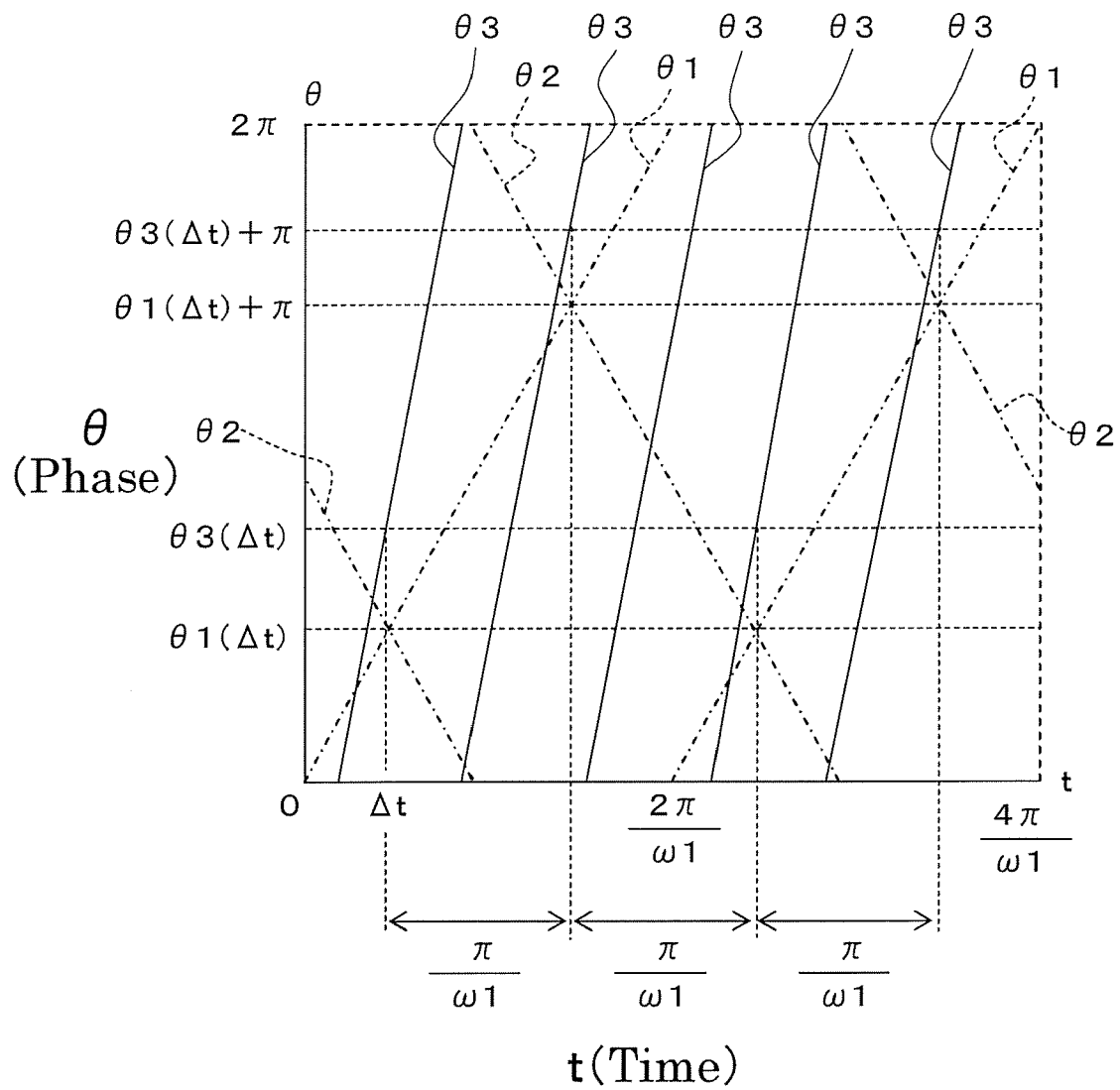
FIG. 7 is a chart showing relationships between the phase $\theta 1$ of the complex vector s1, the phase $\theta 2$ of the complex vector s2, and the phase $\theta 3$ of the complex vector s3 and time "t" according to the first embodiment of the present invention.

FIG. 7 shows relationships between the phase θ1 of the complex vector s1, the phase θ2 of the complex vector s2, and the phase θ3 of the complex vector s3 and time "t" as a chart. It should be noted that θ1 and θ2 are represented as short dashed long dashed lines, and θ3 is represented as solid lines in FIG. 7. As FIG. 7 clearly shows, the phase of the complex vector s3 is θ3(Δt) at the time point Δt+n·π/ω1 (n=0, 2, 4, . . . ), and the phase of the complex vector s3 is θ3(Δt)+π at the time point Δt+n·π/ω1 (n=1, 3, 5, . . . ).

In this way, the phases at which the complex vectors s1 and s2 match each other take constant values such as θ1(Δt) and θ1(Δt)+π. At the same time, the phases of the complex vector s3 at which the complex vectors s1 and s2 match each other also take constant values such as θ3(Δt) and θ3(Δt)+π. Thus, it is significant to measure θ1(Δt) as the value which represents the phase of the input frequency components ±ω1, and θ3(Δt) as the value which represents the phase of the distortion component +3ω1.

It should be noted that a relative phase of the complex vector s3 when the complex vectors s1 and s2 match each other with respect to the phases at which the complex vectors s1 and s2 match each other takes a constant value θ3(Δt)−θ1(Δt).

Moreover, θ4, θ5, θ6, . . . , takes constant values when the complex vectors s1 and s2 match each other. The relative phases of θ4, θ5, θ6, . . . , thus take the constant values θn(Δt)−θ1(Δt) (n=4, 5, 6, . . . ) when the complex vectors s1 and s2 match each other.

The display section 70 displays the measurement result θ1(Δt) by the match time/phase measurement section 50, and the measurement result θ3(Δt) and the like by the distortion component phase measurement section 60.

Figure 8:
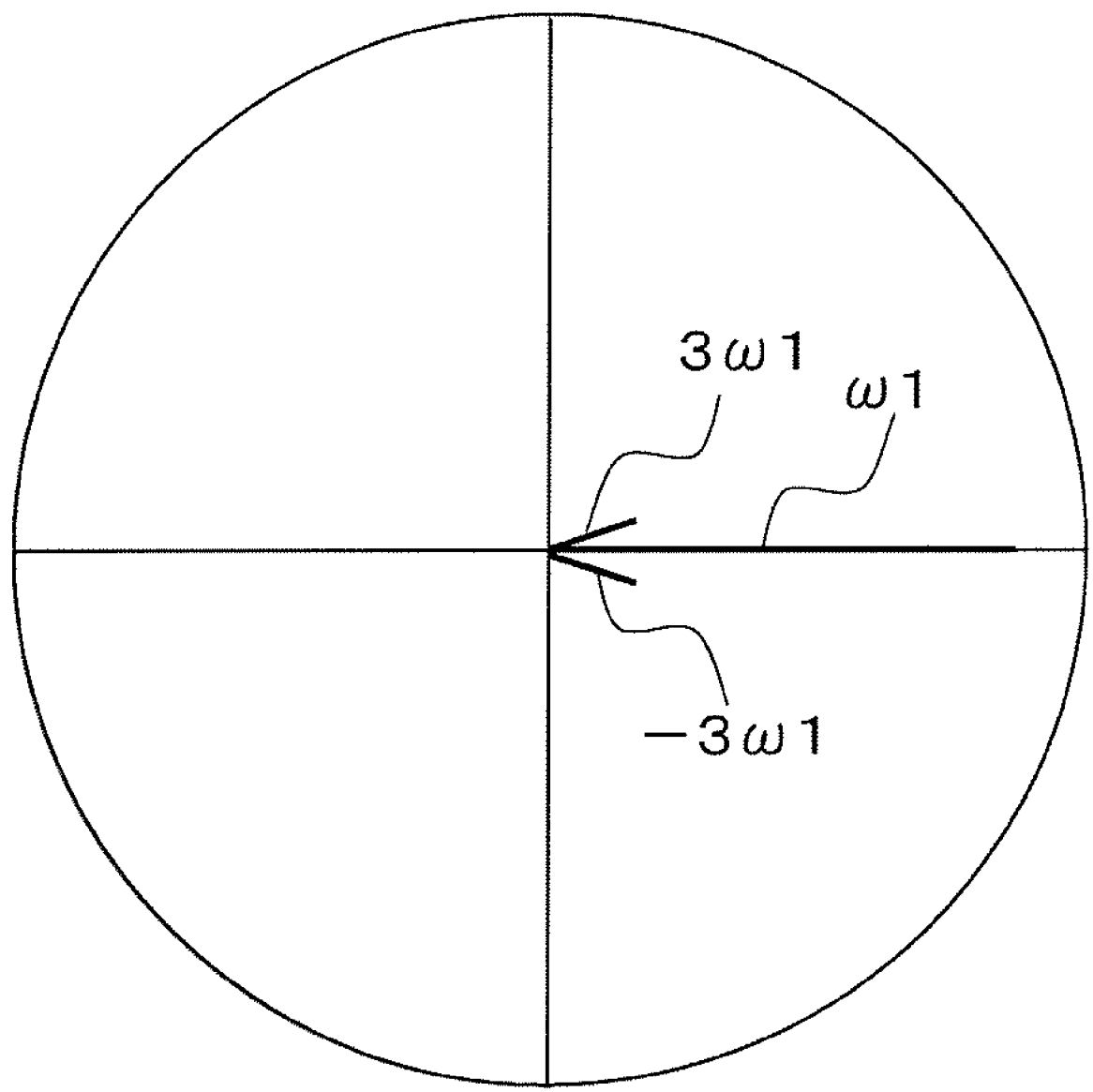
FIG. 8 is a chart showing a display form of a display section 70 according to the first embodiment of the present invention.

FIG. 8 is a chart showing a display form of the display section 70. The display section 70 displays the input frequency component +ω1 and distortion components ±3ω1. It should be noted that vectors are displayed while the phases of the input frequency component and the distortion components are represented as the angles thereof, and amplitudes of the input frequency component and the distortion components are represented as the lengths thereof. It should be noted that the angle of the input frequency component +ω1 is 0 degree. Moreover, the distortion components ±5ω1 have small amplitudes, almost overlap the origin, and are thus not shown.

Figure 9:
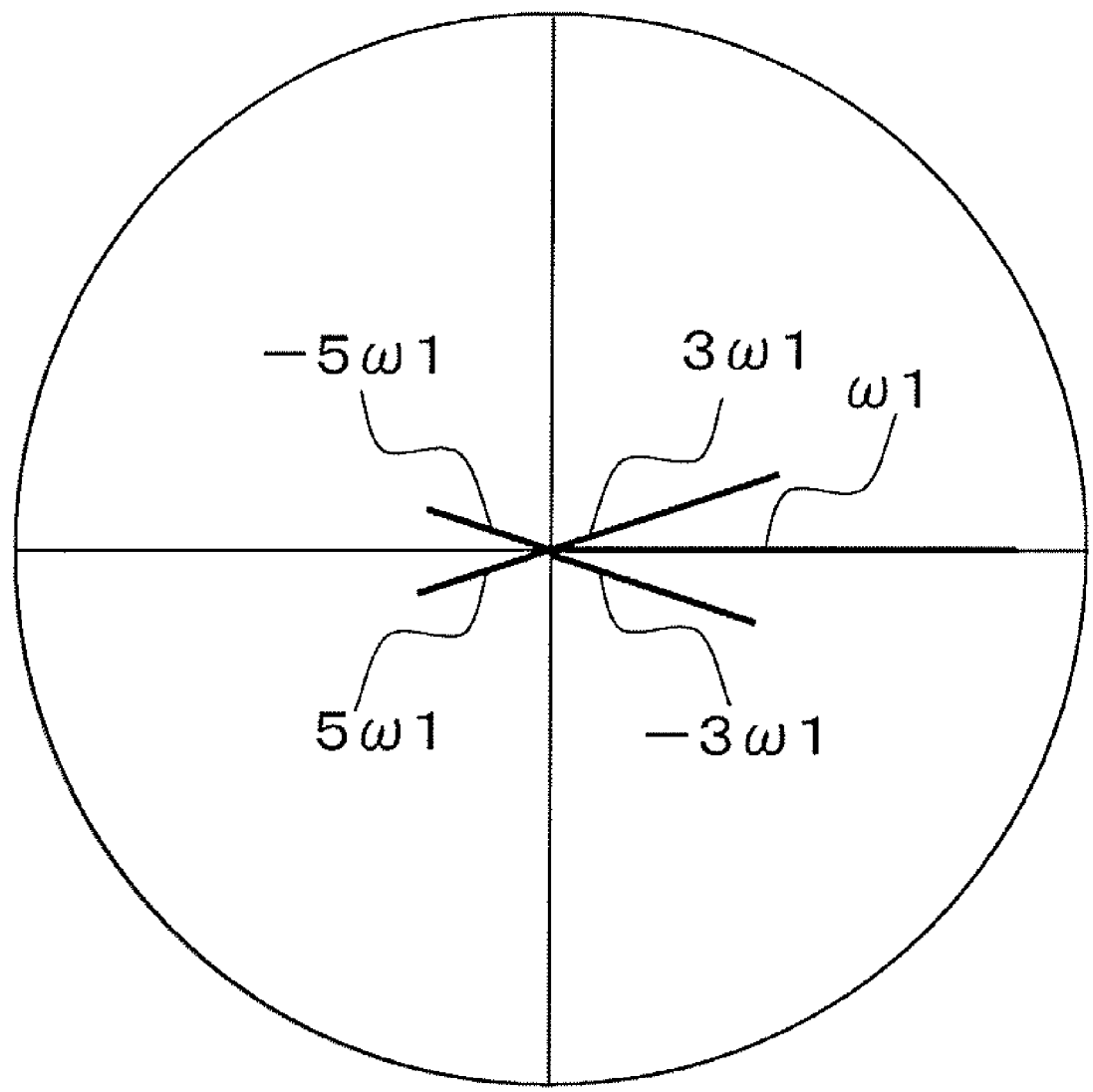
FIG. 9 is a chart showing a variation of the display form of the display section 70 according to the first embodiment of the present invention.

FIG. 9 is a chart showing a variation of the display form of the display section 70. This variation is different from the example shown in FIG. 8 in that there are shown vectors whose lengths are logarithms of the amplitudes of the input frequency component and distortion components. Specifically, the amplitude scale is logarithmically compressed into dBc (while the carrier is considered as a low frequency component of the base signal) (a full range of the amplitude is compressed to 5 dBc, and the origin is compressed to −80 dBc, for example). As a result, the distortion components ±5ω1 can be displayed.

A description will now be given of an operation of the first embodiment.

First, the signal of the frequency ω10 output from the first oscillator 12, and the signal of the frequency ω20 output from the second oscillator 14 are added by the adder 16, and is fed as the input signal to the amplifier 20. The frequency spectrum of the input signal is as shown in FIG. 2(a).

The input signal is amplified by the amplifier 20. It should be noted that the amplifier 20 is a type of non-linear circuits, and thus outputs the distortion components (such as components at the frequency ω30 and the frequency ω40) in addition to the components at the frequency ω10 and the frequency ω20 (refer to FIG. 2(b)).

The output from the amplifier 20 is fed to the phase measurement device 1. The phase measurement device 1 serves to measure the output from the amplifier 20.

First, the output from the amplifier 20 is orthogonally transformed by means of the local frequency ωc by the multipliers 34a and 34b. The local frequency setting section 36 sets the local frequency $\omega c$ to $\omega 0-\omega sep$. The local frequency setting section 36 then sets the local frequency $\omega c$ to $\omega 0+\omega sep$.

The outputs from the multiplier 34a and the multiplier 34b are fed to the complex FFT section 46. The complex FFT section 46 carries out the complex fast Fourier transform, and acquires the complex vectors for the input frequency components ($\omega 1$) and the distortion components (such as $+3\omega 1$). The phase determination section 48 receives the complex vectors, and determines the phases of the respective components.

The match time/phase measurement section 50 receives the phase $\theta 1$ of the input frequency component $+\omega 1$ and the phase $\theta 2$ of the input frequency component $-\omega 1$ of the outputs from the phase determination section 48, and measures the match time point $\Delta t$ which $\theta 1$ and $\theta 2$ match each other for the first time, and the phase $\theta 1(\Delta t)$ ($=\theta 2(\Delta t)$) thereat (refer to FIG. 6).

The distortion component phase measurement section 60 receives the phase $\theta 3$ of the distortion component $+3\omega 1$ and the like of the outputs from the phase determination section 48, further receives the match time point $\Delta t$ from the match time/phase measurement section 50, and measures the phase $\theta 3(\Delta t)$ of the distortion component $+3\omega 1$ and the like at the match time point $\Delta t$ (refer to FIG. 7).

The display section 70 displays the measurement result $\theta 1(\Delta t)$ by the match time/phase measurement section 50, and the measurement result $\theta 3(\Delta t)$ and the like by the distortion component phase measurement section 60.

According to the first embodiment, the match time/phase measurement section 50 is caused to measure $\theta 1(\Delta t)$ significant as a value representing the phase of the input frequency component $\pm \omega 1$. Moreover, the distortion component phase measurement section 60 is caused to measure $\theta 3(\Delta t)$ and the like significant as values representing the phases of the distortion component $+3\omega 1$ and the like. Moreover, the display section 70 is caused to display $\theta 1(\Delta t)$ and $\theta 3(\Delta t)$ and the like. It is thus possible to measure and display the significant values as the values representing the phases of the distortion of the signal output from the amplifier 20 and the input frequency components.

Moreover, according to the first embodiment, since the frequency band to which the A/D converter 32 can adapt should be BW>$3\omega sep$, $\omega sep$ can be larger if BW is constant compared with the case where $\theta 1$, $\theta 2$, $\theta 3$, $\theta 4$, $\theta 5$, and $\theta 6$ are measured at the same time (BW>$5\omega sep$).

Second Embodiment

A second embodiment where the local frequency $\omega c$ is set in three steps ($\omega c=\omega 0$, $\omega c=\omega 0-1.5\omega sep$, $\omega c=\omega 0+1.5\omega sep$) is different from the first embodiment where the local frequency $\omega c$ is set in the two steps ($\omega c=\omega 0-\omega sep$, $\omega c=\omega 0+\omega sep$).

Figure 10:
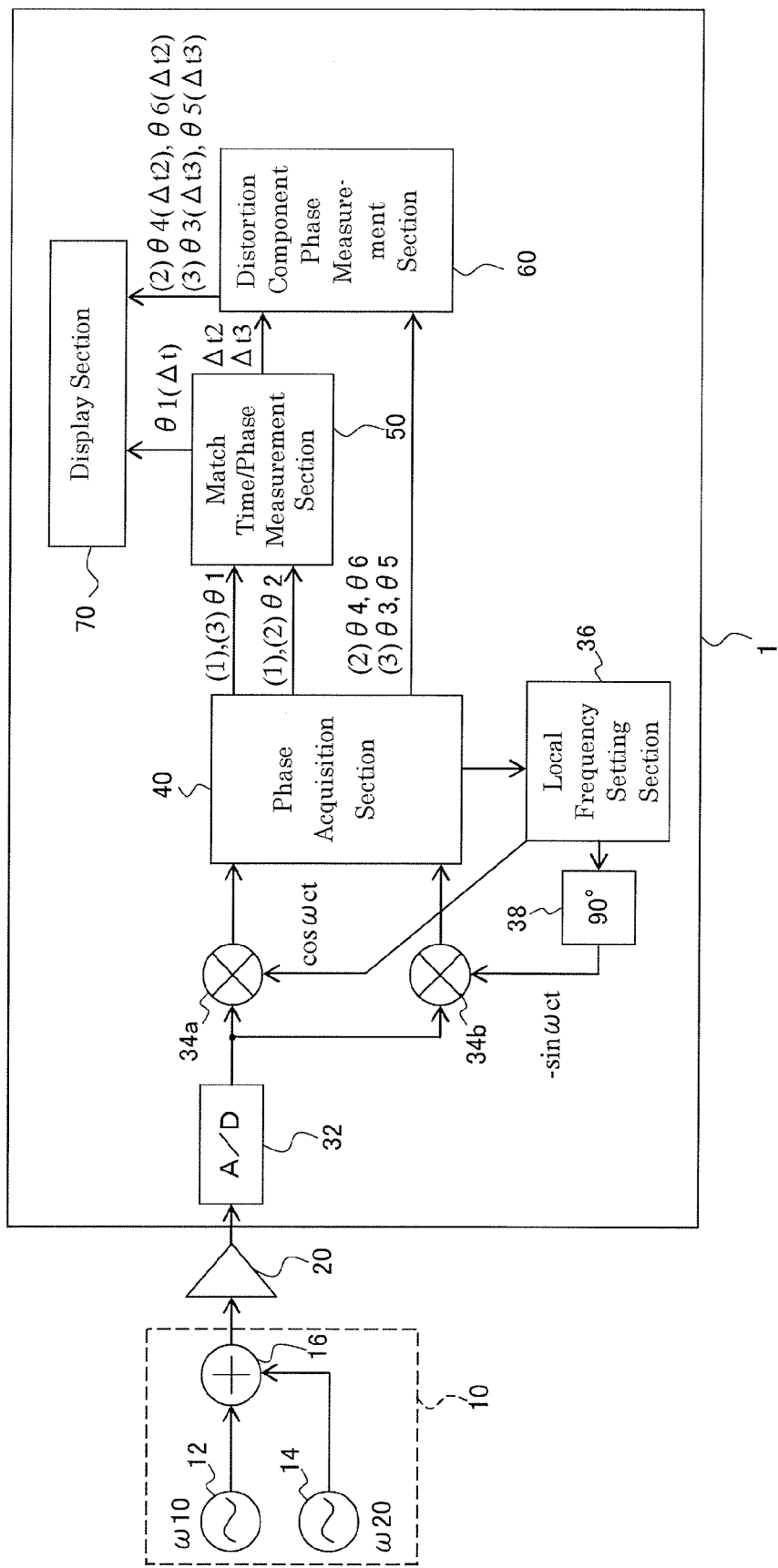
FIG. 10 is a block diagram showing a configuration of an amplifier measurement system according to a second embodiment of the present invention.

FIG. 10 is a block diagram showing a configuraton of an amplifier measurement system according the second embodiment of the present invention. The amplifier measurement system includes the input signal generation section 10, the amplifier (circuit to be measured) 20, the A/D converter 32, the multipliers 34a and 34b, the local frequency setting section 36, the 90-degree phase shifter 38, the phase acquisition section 40, the match time/phase measurement section 50, the distortion component phase measurement section 60, and the display section 70. In the following section, similar components are denoted by the same numerals as of the first embodiment, and will be explained in no more details.

The input signal generation section 10, the amplifier (circuit to be measured) 20, the A/D converter 32, the multipliers 34a and 34b, and the 90-degree phase shifter 38 are the same as the first embodiment, and a description thereof, therefore is omitted.

Figure 12:
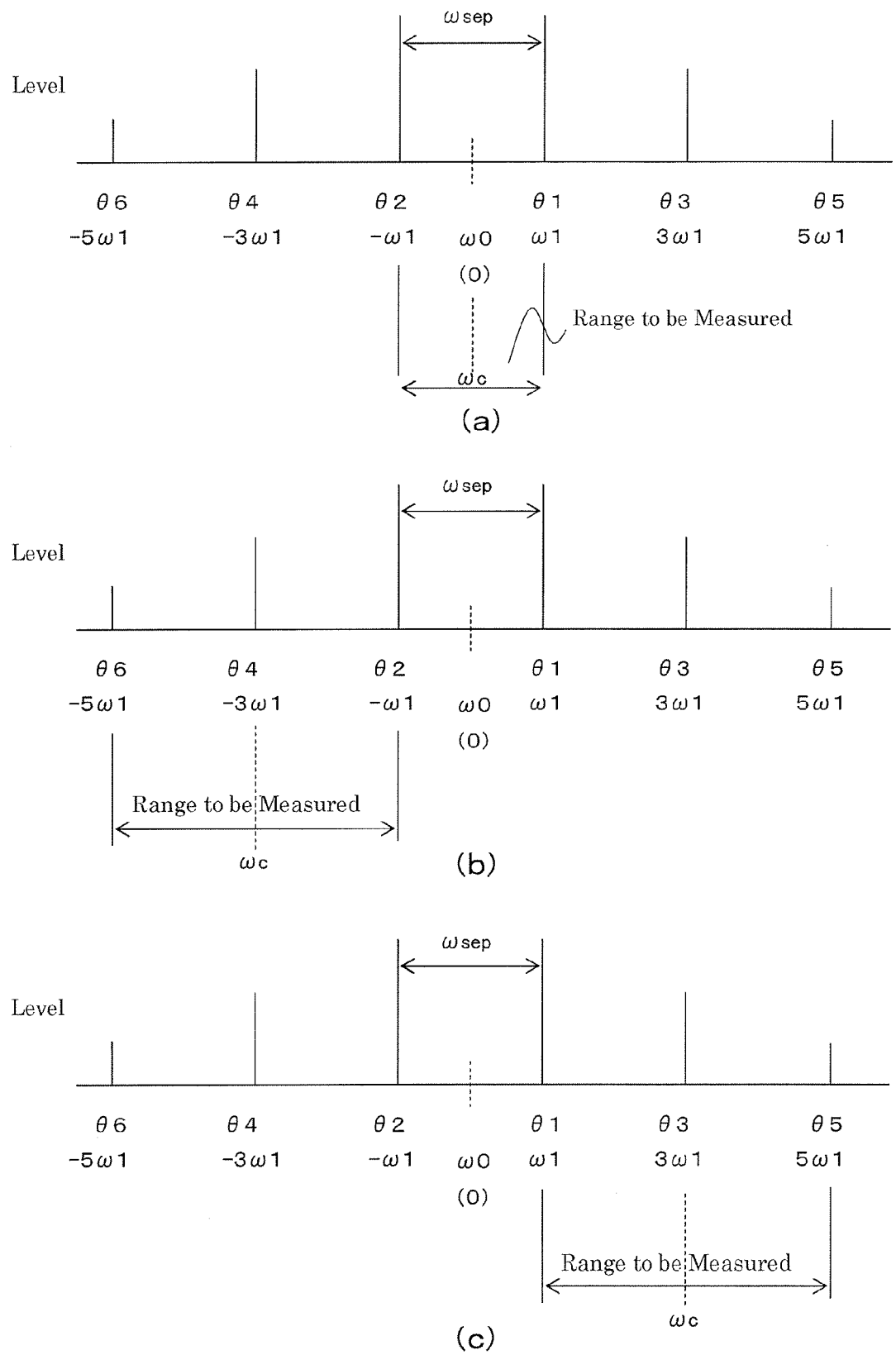
FIG. 12 shows a method to set the local frequency $\omega c$ according to the second embodiment of the present invention.

The local frequency setting section 36 sets the local frequency $\omega c$ for the orthogonal transformation. FIG. 12 shows a method to set the local frequency $\omega c$. In FIG. 12, it is assumed to measure the phase of signals within a range of frequency $-5\omega 1$ to $5\omega 1$. It should be noted that $\omega 1-(-\omega 1)=2\omega 1=\omega sep$. First, as shown in FIG. 12(a), the local frequency $\omega c=\omega 0$. Then, as shown in FIG. 12(b), the local frequency $\omega c=\omega 0-1.5\omega sep$. If $\omega 0=0$, there holds $\omega c=(-\omega 1+(-5\omega 1))/2=-3\omega 1$. Finally, as shown in FIG. 12(c), the local frequency $\omega c=\omega 0+1.5\omega sep$. If $\omega 0=0$, there holds $\omega c=(\omega 1+5\omega 1)/2=3\omega 1$.

The phase acquisition section 40 acquires the phases of the input frequency components ($\pm \omega 1$) and the distortion components (such as $+3\omega 1$) in the outputs from the multipliers 34a and 34b. A configuration of the phase acquisition section 40 is the same as that of the first embodiment (refer to FIG. 4).

The phase acquisition section 40 includes the frequency shift section 44, the complex FFT (Fast Fourier Transform) section 46, and the phase determination section 48. The frequency shift section 44 and the complex FFT (Fast Fourier Transform) section 46 are the same as those of the first embodiment, and will be explained in no more details.

The phase determination section 48 first refers to FIG. 12(a) to determine $\theta 1$ and $\theta 2$. On this occasion, the local frequency $\omega c$ set by the local frequency setting section 36 is $\omega 0$ (refer to (1) in FIG. 10).

In this case, it is necessary to measure across a bandwidth from $-\omega 1$ to $+\omega 1$ with the local frequency $\omega c$ as the center. Therefore, the frequency bandwidth BW to which the A/D converter 32 can adapt is to be BW>$+\omega 1-(-\omega 1)=2\omega 1=\omega sep$.

The phase determination section 48 then determines $\theta 2$, $\theta 4$, and $\theta 6$ with reference to FIG. 12(b) (refer to (2) in FIG. 10). On this occasion, the local frequency $\omega c$ set by the local frequency setting section 36 is $\omega 0-1.5\omega sep$.

In this case, it is necessary to measure across a bandwidth $-5\omega 1$ to $-\omega 1$ with the local frequency $\omega c$ as the center. Therefore, the frequency bandwidth BW to which the A/D converter 32 can adapt is to be BW>$-5\omega 1-(-\omega 1)=4\omega 1=2\omega sep$.

The phase determination section 48 finally determines $\theta 1$, $\theta 3$, and $\theta 5$ with reference to FIG. 12(c) (refer to (3) in FIG. 10). On this occasion, the local frequency sac set by the local frequency setting section 36 is $\omega 0+1.5\omega sep$.

In this case, it is necessary to measure across a bandwidth $+\omega 1$ to $+5\omega 1$ with the local frequency $\omega c$ as the center. Therefore, the frequency bandwidth BW to which the A/D converter 32 can adapt is to be BW>$+5\omega 1-\omega 1=4\omega 1=2\omega sep$.

It should be noted that when $\theta 1$, $\theta 2$, $\theta 3$, $\theta 4$, $\theta 5$, and $\theta 6$ are measured at the same time, it is necessary to measure across a bandwidth from $-5\omega 1$ to $+5\omega 1$. Therefore, the frequency bandwidth BW to which the A/D converter 32 can adapt is to be BW>$+5\omega 1-(-5\omega 1)=10\omega 1=5\omega sep$.

Consequently, if $\theta 1$ and $\theta 2$ are determined, $\theta 2$, $\theta 4$, and $\theta 6$ are then determined, and $\theta 1$, $\theta 3$, and $\theta 5$ are finally determined as in the second embodiment, since it is necessary that BW>$2\omega sep$, $\omega sep$ can be larger if BW is constant.

With reference again to FIG. 1, the match time/phase measurement section 50 measures a match time point $\Delta t$ when the phase $\theta 1$ of the input frequency component $+\omega 1$ and the phase $\theta 2$ of the input frequency component $-\omega 1$ match each other for the first time, and the phase $\theta 1(\Delta t)$ ($=\theta 2(\Delta t)$) thereat based upon the acquisition result of the phase acquisition section 40.

Figure 11:
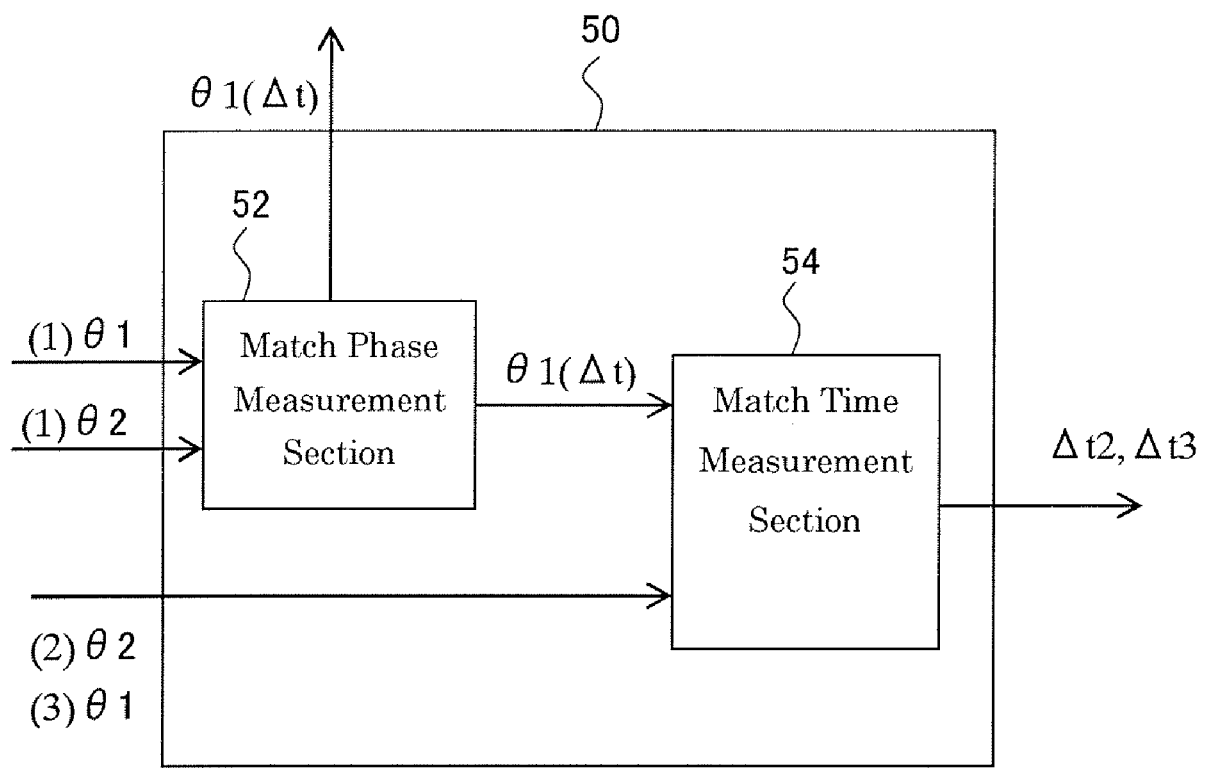
FIG. 11 is a block diagram showing a configuration of a match time/phase measurement section 50 according to the second embodiment of the present invention.

FIG. 11 is a block diagram showing a configuration of the match time/phase measurement section 50. The match time/phase measurement section 50 includes a match phase measurement section 52 and a match time measurement section 54.

The match phase measurement section 52 measures the match phase $\theta1(\Delta t)$ when the phase $\theta1$ of the input frequency component $+\omega1$ and the phase $\theta2$ of the input frequency component $-\omega1$ match each other while the local frequency $\omega c=\omega0$.

The match time measurement section 54 measures a time point $\Delta t2$ when $\theta2$ matches $\theta1(\Delta t)$ while the local frequency $\omega c$ is $\omega0-1.5\omega sep$, and a time point $\Delta t3$ when $\theta1$ matches $\theta1(\Delta t)$ while the local frequency $\omega c$ is $\omega0+1.5\omega sep$.

The distortion component phase measurement section 60 measures the phase $\theta3(\Delta t3)$ of the distortion component $+3\omega1$ and the like at the match time points $\Delta t2$ and $\Delta t3$ based upon the acquisition result by the phase acquisition section 40. The match time points $\Delta t2$ and $\Delta t3$ are acquired from the match time/phase measurement section 50. It should be noted that the phases $\theta4$, $\theta5$, and $\theta6$ of other distortion components (such as $-3\omega1$ and $\pm5\omega1$) are acquired similarly.

Namely, the distortion component phase measurement section 60 measures the phases $\theta4$ and $\theta6$ of the distortion components $-3\omega1$ and $-5\omega1$ at the time point $\Delta t2$ ($\theta2$ matches $\theta1$ at this time point) when $\theta2$ matches $\theta1(\Delta t)$ while the local frequency $\omega c$ is $\omega0-1.5\omega sep$. Moreover, the distortion component phase measurement section 60 measures the phases $\theta3$ and $\theta5$ of the distortion components $+3\omega1$ and $+5\omega1$ at the time point $\Delta t3$ ($\theta2$ matches $\theta1$ at this time point) when $\theta1$ matches $\theta1(\Delta t)$ while the local frequency $\omega c$ is $\omega0+1.5\omega sep$.

The measurement of the distortion phase is the same as that of the first embodiment, and will be explained in no more details.

The display section 70 displays the measurement result $\theta1(\Delta t)$ by the match time/phase measurement section 50, and the measurement result $\theta3(\Delta t3)$ and the like by the distortion component phase measurement section 60. The display form of the display section 70 is the same as that of the first embodiment.

A description will now be given of an operation of the second embodiment.

First, the signal of the frequency a) 10 output from the first oscillator 12, and the signal of the frequency a) 20 output from the second oscillator 14 are added by the adder 16, and is fed as the input signal to the amplifier 20. The frequency spectrum of the input signal is as shown in FIG. 2(a).

The input signal is amplified by the amplifier 20. It should be noted that the amplifier 20 is a type of non-linear circuits, and thus outputs the distortion components (such as components with the frequency $\omega30$ and the frequency $\omega40$) in addition to the components with the frequency $\omega10$ and the frequency $\omega20$ (refer to FIG. 2(b)).

The output from the amplifier 20 is fed to the phase measurement device 1. The phase measurement device 1 serves to measure the output from the amplifier 20.

First, the output from the amplifier 20 is orthogonally transformed by means of the local frequency $\omega c$ by the multipliers 34a and 34b. The local frequency setting section 36 sets the local frequency $\omega c$ to $\omega0$. The local frequency setting section 36 then sets the local frequency $\omega c$ to $\omega0-1.5\omega sep$. The local frequency setting section 36 finally sets the local frequency $\omega c$ to $\omega0+1.5\omega sep$.

The outputs from the multiplier 34a and the multiplier 34b are fed to the complex FFT section 46. The complex FFT section 46 carries out the complex fast Fourier transform, and acquires the complex vectors for the input frequency components ($\omega1$) and the distortion components (such as $+3\omega1$). The phase determination section 48 receives the complex vectors, and determines the phases of the respective components.

The match time/phase measurement section 50 receives the phase $\theta1$ of the input frequency component $+\omega1$ and the phase $\theta2$ of the input frequency component $-\omega1$ of the outputs from the phase determination section 48, and measures the match time point $\Delta t$ which $\theta1$ and $\theta2$ match each other for the first time, and the phase $\theta1(\Delta t)$ ($=\theta2(\Delta t)$) thereat.

The distortion component phase measurement section 60 receives the phase $\theta3$ of the distortion component $+3\omega1$ and the like of the outputs from the phase determination section 48, further receives the match time points $\Delta t2$ and $\Delta t3$ from the match time/phase measurement section 50, and measures the phase $\theta3(\Delta t3)$ of the distortion component $+3\omega1$ and the like at the match time points $\Delta t2$ and $\Delta t3$.

The display section 70 displays the measurement result $\theta1(\Delta t)$ by the match time/phase measurement section 50, and the measurement result $\theta3(\Delta t3)$ and the like by the distortion component phase measurement section 60.

According to the second embodiment, there are obtained the same effects as in the first embodiment.

Moreover, according to the second embodiment, since the frequency band to which the A/D converter 32 can adapt should be BW>2$\omega sep$, $\omega sep$ can be larger if BW is constant compared with the case where $\theta1$, $\theta2$, $\theta3$, $\theta4$, $\theta5$, and $\theta6$ are measured at the same time (BW>5$\omega sep$).

Third Embodiment

A third embodiment is obtained by adding a common reference signal source 80, a phase change quantity acquisition section 90, and a distortion component phase compensation section 92 to the second embodiment in order to reproduce $\theta1$ and $\theta2$ when the local frequency setting section 36 changes the local frequency $\omega c$ from $\omega0$ to $\omega0-1.5\omega sep$ ($\omega0+1.5\omega sep$).

Figure 13:
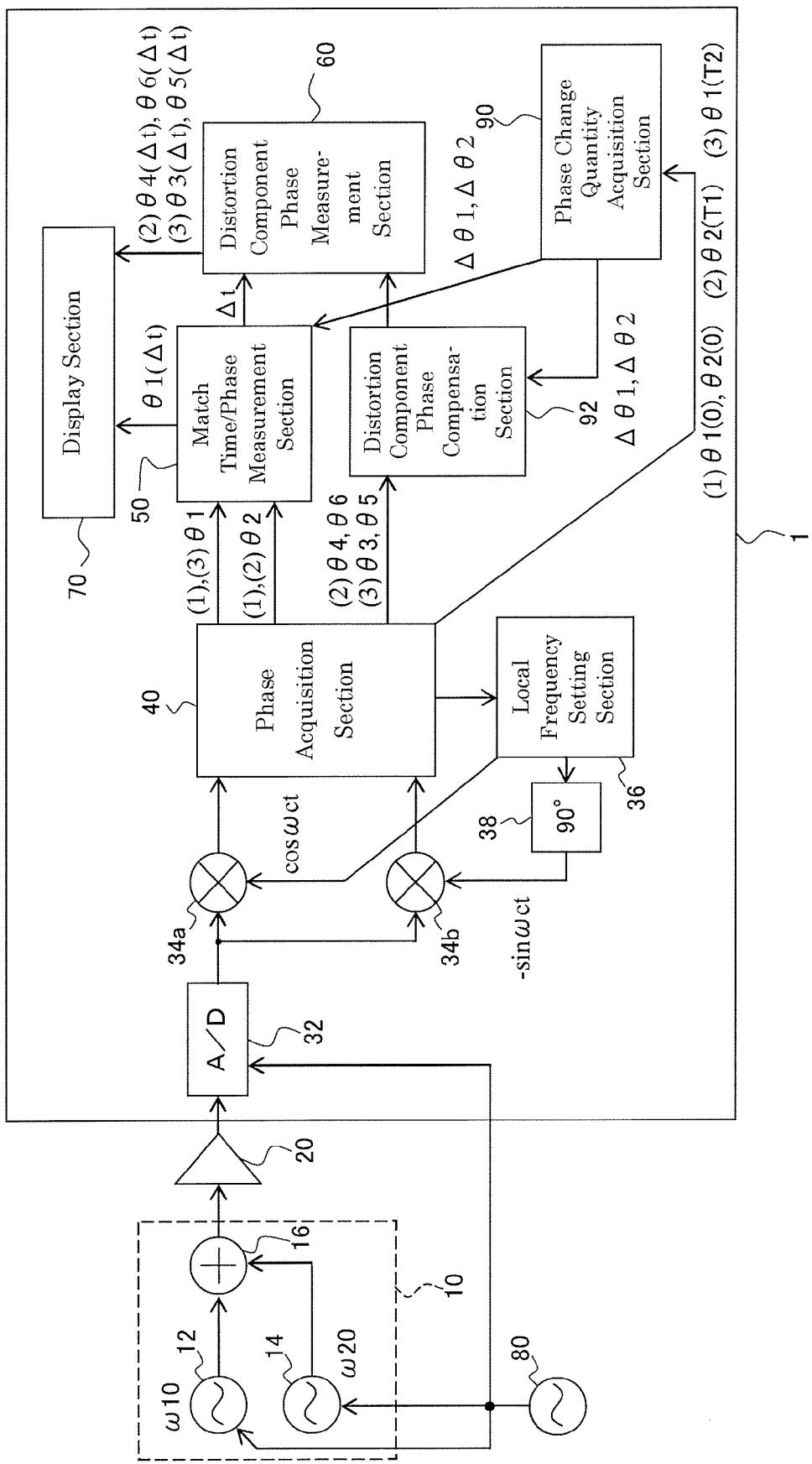
FIG. 13 is a block diagram showing a configuration of an amplifier measurement system according to a third embodiment of the present invention.

FIG. 13 is a block diagram showing a configuration of an amplifier measurement system according the third embodiment of the present invention. The amplifier measurement system includes the input signal generation section 10, the amplifier (circuit to be measured) 20, the A/D converter 32, the multipliers 34a and 34b, the local frequency setting section 36, the 90-degree phase shifter 38, the phase acquisition section 40, the match time/phase measurement section 50, the distortion component phase measurement section 60, the display section 70, the common reference signal source 80, the phase change quantity acquisition section 90, and the distortion component phase compensation section 92. In the following section, similar components are denoted by the same numerals as of the second embodiment, and will be explained in no more details.

The input signal generation section 10, the amplifier (circuit to be measured) 20, the A/D converter 32, the multipliers 34a and 34b, the local frequency setting section 36, the 90-degree phase shifter 38, the phase acquisition section 40, the match time/phase measurement section 50, the distortion component phase measurement section 60, the display section 70 are the same as the second embodiment, and a description thereof, therefore is omitted. It should be noted that a description will later be given of the match time measurement section 54 of the match time/phase measurement section 50.

The common reference signal source 80 supplies a common reference signal common to the input signal generation section 10, and the A/D converter 32. The input signal generation section 10 determines generation timing of the input signals based upon the common reference signal. The A/D converter 32 determines generation timing for a sampling clock signal and a trigger signal based upon the common reference signal. It should be noted that the generation timing of the trigger signal is set to have the same period of an integer multiple of the one period of the input signal.

The phase change quantity acquisition section 90 acquires a phase change quantity of the highest frequency component $\theta1$ or the lowest frequency component $\theta2$ of the input frequency components which have changed each time when the phase acquisition section 40 changes the components for which the phases are acquired.

Specifically, when the phase acquisition section 40 selects the components for which $\theta1$ and $\theta2$ are acquired, the phase change quantity acquisition section 90 acquires $\theta1(0)$ and $\theta2(0)$ from the phase acquisition section 40.

When the phase acquisition section 40 changes components to those for which $\theta2$, $\theta4$, and $\theta6$ are acquired, the phase change quantity acquisition section 90 acquires $\theta2(T1)$ from the phase acquisition section 40. It should be noted that T1 is such a value that $\theta2(T1)=\theta2(0)$ ($T1=2n\pi/\omega1$, n is a positive integer). However, when the phase acquisition section 40 changes components for which phases are acquired, there is generated an error, and $\theta2(T1)=\theta2(0)$ thus does not hold. If the error is denoted as $\Delta\theta2$, $\theta2(T1)=\theta2(0)+\Delta\theta2$. Thus, $\Delta\theta2$ is obtained as $\Delta\theta2=\theta2(T1)-\theta2(0)$, and is fed to the match time measurement section 54 and the distortion component phase compensation section 92.

Moreover, when the phase acquisition section 40 changes components to those for which $\theta1$, $\theta3$, and $\theta5$ are acquired, the phase change quantity acquisition section 90 acquires $\theta1(T2)$ from the phase acquisition section 40. It should be noted that T2 is such a value that $\theta1(T2)=\theta1(0)$ ($T2=2n\pi/\omega1$, n is a positive integer). However, when the phase acquisition section 40 changes components for which phases are acquired, there is generated an error, and $\theta1(T2)=\theta1(0)$ thus does not hold. If the error is denoted as $\Delta\theta1$, $\theta1(T2)=\theta1(0)+\Delta\theta1$. Thus, $\Delta\theta1$ is obtained as $\Delta\theta1=\theta1(T2)-\theta1(0)$, and is fed to the match time measurement section 54 and the distortion component phase compensation section 92.

The match time measurement section 54 acquires the errors $\Delta\theta1$ and $\Delta\theta2$ from the phase change quantity acquisition section 90, and corrects $\theta2$ while the local frequency $\omega c$ is $\omega0-1.5\omega sep$, and $\theta1$ while the local frequency $\omega c$ is $\omega0+1.5\omega sep$. Namely, the errors $\Delta\theta2$ and $\Delta\theta1$ are subtracted. There is then measured a time point $\Delta t$ when $\theta2$ and $\theta1$ from which the errors $\Delta\theta2$ and $\Delta\theta1$ are respectively subtracted match $\theta1(\Delta t)$.

The distortion component phase compensation section 92 receives $\theta4$ and $\theta6$, and $\theta3$ and $\theta5$ from the phase determination section 48. The distortion component phase compensation section 92 then subtracts the error $\Delta\theta2$ from $\theta4$ and $\theta6$, and subtracts the error $\Delta\theta1$ from $\theta3$ and $\theta5$, and supplies the distortion component phase measurement section 60 with the results.

A description will now be given of an operation of the third embodiment.

First, the signal of the frequency $\omega10$ output from the first oscillator 12, and the signal of the frequency $\omega20$ output from the second oscillator 14 are added by the adder 16, and is fed as the input signal to the amplifier 20. The frequency spectrum of the input signal is as shown in FIG. 2(a).

The input signal is amplified by the amplifier 20. It should be noted that the amplifier 20 is a type of non-linear circuits, and thus outputs the distortion components (such as components with the frequency $\omega30$ and the frequency $\omega40$) in addition to the components with the frequency $\omega10$ and the frequency $\omega20$ (refer to FIG. 2(b)).

The output from the amplifier 20 is fed to the phase measurement device 1. The phase measurement device 1 serves to measure the output from the amplifier 20.

First, the output from the amplifier 20 is orthogonally transformed by means of the local frequency $\omega c$ by the multipliers 34a and 34b. The local frequency setting section 36 sets the local frequency $\omega c$ to $\omega0$. The local frequency setting section 36 then sets the local frequency $\omega c$ to $\omega0-1.5\omega sep$. The local frequency setting section 36 finally sets the local frequency $\omega c$ to $\omega0+1.5\omega sep$.

The outputs from the multiplier 34a and the multiplier 34b are fed to the complex FFT section 46. The complex FFT section 46 carries out the complex fast Fourier transform, and acquires the complex vectors for the input frequency components ($\pm\omega1$) and the distortion components (such as $+3\omega1$). The phase determination section 48 receives the complex vectors, and determines the phases of the respective components.

The phase change quantity acquisition section 90 acquires $\theta1(0)$, $\theta2(0)$, $\theta2(T1)$, and $\theta1(T2)$ from the phase determination section 48. The phase change quantity acquisition section 90 obtains $\Delta\theta2$ while the error $\Delta\theta2=\theta2(T1)-\theta2(0)$, and $\Delta\theta1$ while the error $\Delta\theta1=\theta1(T2)-\theta1(0)$. The errors $\Delta\theta1$ and $\Delta\theta2$ are fed to the match time measurement section 54.

The match time/phase measurement section 50 receives the phase $\theta1$ of the input frequency component $+\omega1$ and the phase $\theta2$ of the input frequency component $-\omega1$ of the outputs from the phase determination section 48, and measures the match time point $\Delta t$ which $\theta1$ and $\theta2$ match each other for the first time, and the phase $\theta1(\Delta t)$ ($=\theta2(\Delta t)$) thereat. It should be noted that the match time measurement section 54 corrects $\theta2$ while the local frequency $\omega c$ is $\omega0-1.5\omega sep$, and $\theta1$ while the local frequency $\omega c$ is $\omega0+1.5\omega sep$ by means of the errors $\Delta\theta1$ and $\Delta\theta2$ supplied from the phase change quantity acquisition section 90. Namely, the errors $\Delta\theta2$ and $\Delta\theta1$ are subtracted.

The distortion component phase compensation section 92 receives the phase $\theta3$ of the distortion component $+3\omega1$ and the like of the outputs from the phase determination section 48. The distortion component phase compensation section 92 is supplied with the errors $\Delta\theta1$ and $\Delta\theta2$ from the phase change quantity acquisition section 90. The distortion component phase compensation section 92 subtracts the error $\Delta\theta2$ from $\theta4$ and $\theta6$, and subtracts the error $\Delta\theta1$ from $\theta3$ and $\theta5$, and supplies the distortion component phase measurement section 60 with the results.

Moreover, the distortion component phase measurement section 60 receives the match time point $\Delta t$ from the match time/phase measurement section 50, and measures the phase $\theta3(\Delta t)$ of the distortion component $+3\omega1$ at the match time point $\Delta t$ and the like.

The display section 70 displays the measurement result $\theta1(\Delta t)$ by the match time/phase measurement section 50, and the measurement result $\theta3(\Delta t)$ and the like by the distortion component phase measurement section 60.

According to the third embodiment, there are obtained the same effects as in the second embodiment.

Moreover, according to the third embodiment, by means of the common reference signal source 80, it is possible to reduce the phase change quantities (errors $\Delta\theta1$ and $\Delta\theta2$) of the highest frequency component $\theta1$ and the lowest frequency component $\theta2$ of the input frequency components which have changed each time when the phase acquisition section 40 changes the components for which the phases are acquired.

Further, by means of the phase change quantity acquisition section 90, it is possible to acquire the phase change quantities (errors $\Delta\theta1$ and $\Delta\theta2$) of the highest frequency component $\theta1$ and the lowest frequency component $\theta2$ of the input frequency components which have changed each time when the phase acquisition section 40 changes the components for which the phases are acquired. The acquired errors $\Delta\theta1$ and $\Delta\theta2$ are used by the match time measurement section 54 and the distortion component phase compensation section 92, and there are corrected $\theta2$, $\theta4$, and $\theta6$ while the local frequency $\omega c$ is $\omega0-1.5\omega sep$, and $\theta1$, $\theta3$, and $\theta5$ while the local frequency $\omega c$ is $\omega0+1.5\omega sep$. Thus, the errors $\Delta\theta1$ and $\Delta\theta2$ do not cause errors in the measurement of the phases of the distortion components.

Fourth Embodiment

The fourth embodiment is the third embodiment improved to measure seventh and higher distortion phases.

Figure 14:
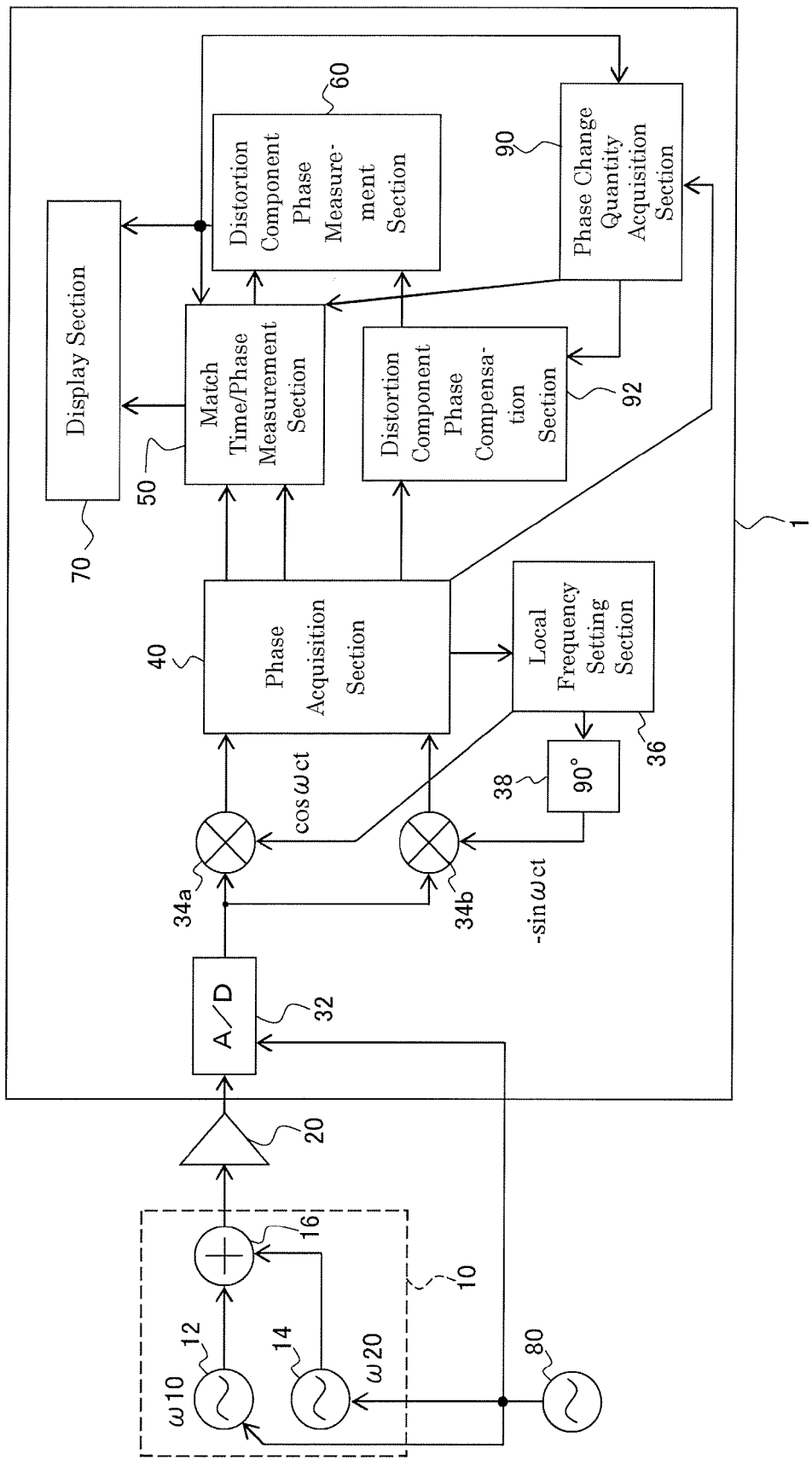
FIG. 14 is a block diagram showing a configuration of an amplifier measurement system according to a fourth embodiment of the present invention.

FIG. 14 is a block diagram showing a configuration of an amplifier measurement system according the fourth embodiment of the present invention. The amplifier measurement system includes the input signal generation section 10, the amplifier (circuit to be measured) 20, the A/D converter 32, the multipliers 34a and 34b, the local frequency setting section 36, the 90-degree phase shifter 38, the phase acquisition section 40, the match time/phase measurement section 50, the distortion component phase measurement section 60, the display section 70, the common reference signal source 80, the phase change quantity acquisition section 90, and the distortion component phase compensation section 92. In the following section, similar components are denoted by the same numerals as of the third embodiment, and will be explained in no more details.

The input signal generation section 10, the amplifier (circuit to be measured) 20, the A/D converter 32, and the multipliers 34a and 34b are the same as the third embodiment, and a description thereof, therefore is omitted.

Figure 15:
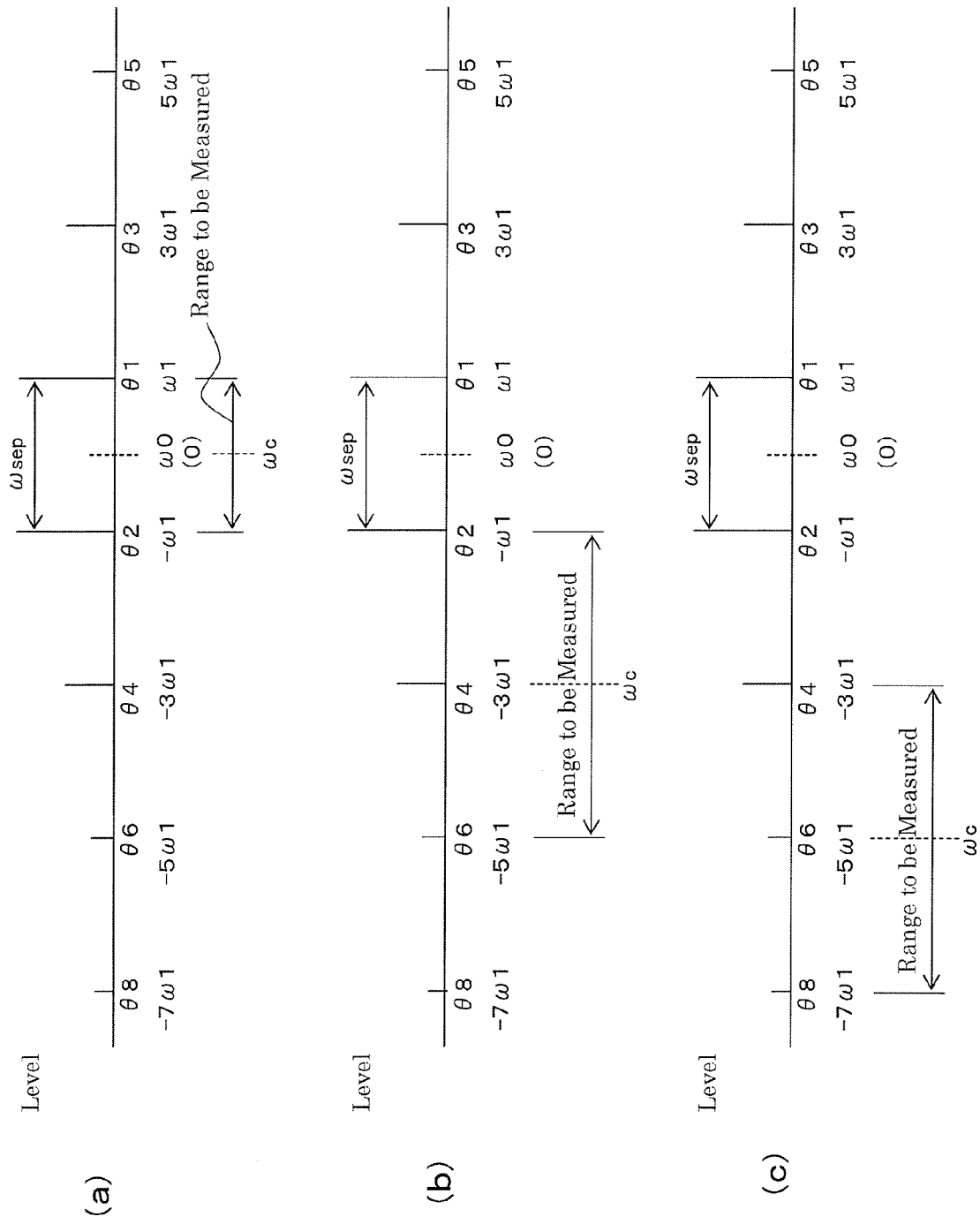
FIG. 15 shows a method to set the local frequency $\omega c$.
Figure 16:
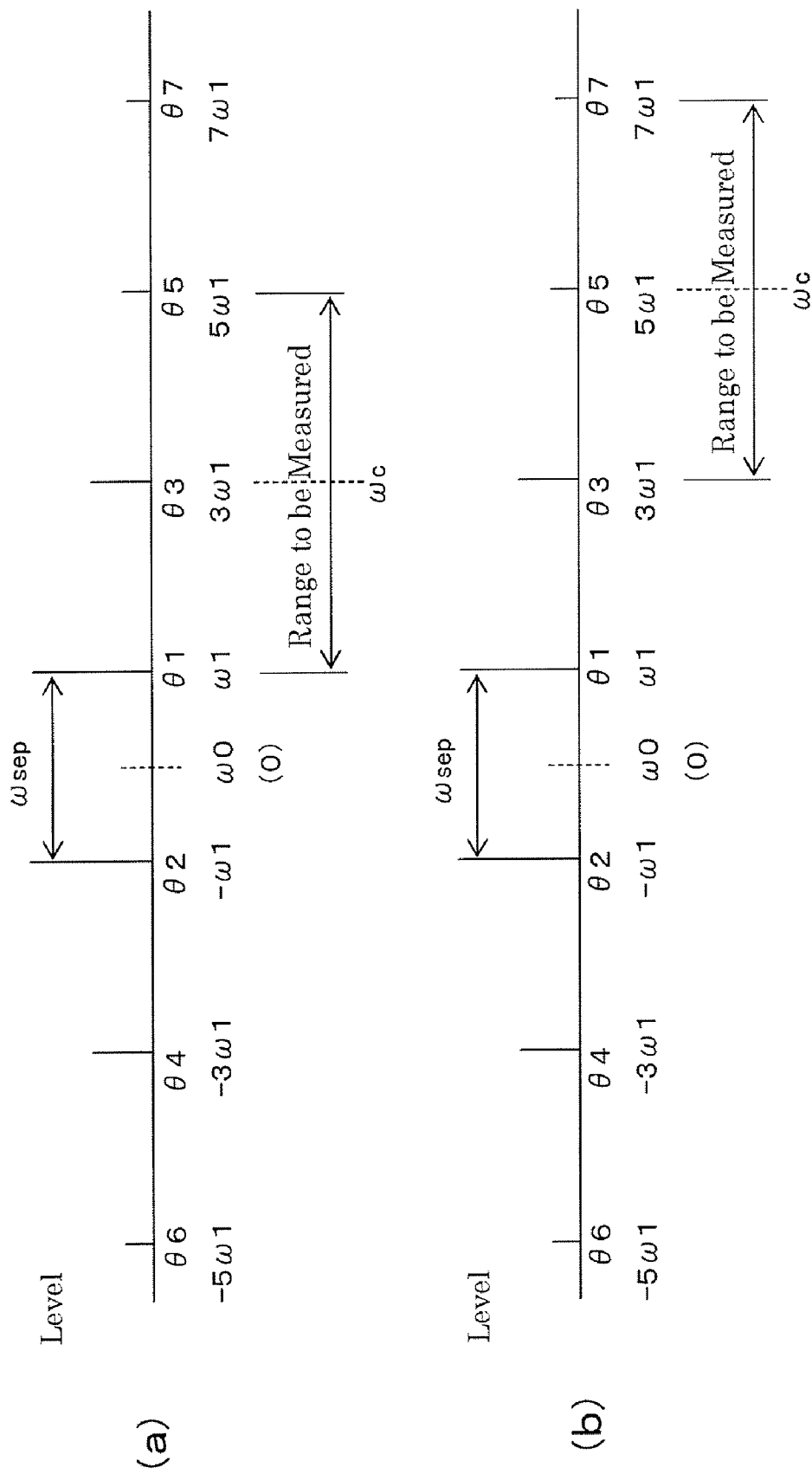
FIG. 16 shows a method to set the local frequency $\omega c$.

The local frequency setting section 36 sets the local frequency $\omega c$ for the orthogonal transformation. FIGS. 15 and 16 show a method to set the local frequency $\omega c$. It should be noted that $\omega1-(-\omega1)=2\omega1=\omega sep$.

First, as shown in FIG. 15(a), the local frequency $\omega c=\omega0$. Then, as shown in FIG. 15(b), the local frequency $\omega c=\omega0-1.5\omega sep$. If $\omega0=0$, there holds $\omega c=(-\omega1+(-5\omega1))/2=-3\omega1$. Then, as shown in FIG. 15(c), the local frequency $\omega c=\omega0-2.5\omega sep$. If $\omega0=0$, there holds $\omega c=((-3\omega1)+(-7\omega1))/2=-5\omega1$.

Then, as shown in FIG. 16(a), the local frequency $\omega c=\omega0+1.5\omega sep$. If $\omega0=0$, there holds $\omega c=\omega1+5\omega1)/2=-3\omega1$. Finally, as shown in FIG. 16(b), the local frequency $\omega c=\omega0+2.5\omega sep$. If $\omega0=0$, there holds $\omega c=(3\omega1+7\omega1)/2=5\omega1$.

It should be noted that the local frequency $\omega c$ is an average of the highest value and the lowest value of the frequency of signals for which the phase determination section 48 acquires the phases. For example, with reference to FIG. 16(b), $\theta3$, $\theta5$, and $\theta7$ are acquired. On this occasion, the local frequency $\omega c$ set by the local frequency setting section 36 is an average $5\omega1$ of the highest value $7\omega1$ and the lowest value $3\omega1$ of the frequency of the signals for which the phase determination section 48 acquires the phases.

The phase acquisition section 40 acquires the phases of the input frequency components ($\pm\omega1$) and the distortion components (such as $+3\omega1$) in the outputs from the multipliers 34a and 34b. A configuration of the phase acquisition section 40 is the same as that of the first embodiment (refer to FIG. 4). The phase acquisition section 40 includes the frequency shift section 44, the complex FFT (Fast Fourier Transform) section 46, and the phase determination section 48. The frequency shift section 44 and the complex FFT (Fast Fourier Transform) section 46 are the same as those of the first embodiment, and will be explained in no more details.

The phase determination section 48 first refers to FIG. 15(a) to determine $\theta1$ and $\theta2$. On this occasion, the local frequency $\omega c$ set by the local frequency setting section 36 is $\omega0$.

In this case, it is necessary to measure across a bandwidth from $-\omega1$ to $+\omega1$ with the local frequency $\omega c$ as the center. Therefore, the frequency bandwidth BW to which the A/D converter 32 can adapt is to be $BW>+\omega1-(-\omega1)=2\omega1=\omega sep$.

The phase determination section 48 then determines $\theta2$, $\theta4$, and $\theta6$ with reference to FIG. 15(b). On this occasion, the local frequency $\omega c$ set by the local frequency setting section 36 is $\omega0-1.5\omega sep$.

In this case, it is necessary to measure across a bandwidth $-5\omega1$ to $-\omega1$ with the local frequency $\omega c$ as the center. Therefore, the frequency bandwidth BW to which the A/D converter 32 can adapt is to be $BW>-5\omega1-(-\omega1)=4\omega1=2\omega sep$.

The phase determination section 48 then determines $\theta4$, $\theta6$, and $\theta8$ with reference to FIG. 15(c). On this occasion, the local frequency $\omega c$ set by the local frequency setting section 36 is $\omega0-2.5\omega sep$.

In this case, it is necessary to measure across a bandwidth $-7\omega1$ to $-3\omega1$ with the local frequency $\omega c$ as the center. Therefore, the frequency bandwidth BW to which the A/D converter 32 can adapt is to be $BW>-7\omega1-(-3\omega1)=4\omega1=2\omega sep$.

Moreover, the phase determination section 48 determines $\theta1$, $\theta3$, and $\theta5$ with reference to FIG. 16(a). On this occasion, the local frequency $\omega c$ set by the local frequency setting section 36 is $\omega0+1.5\omega sep$.

In this case, it is necessary to measure across a bandwidth $+\omega1$ to $+5\omega1$ with the local frequency $\omega c$ as the center. Therefore, the frequency bandwidth BW to which the A/D converter 32 can adapt is to be $BW>+5\omega1-\omega1=4\omega1=2\omega sep$.

The phase determination section 48 finally determines $\theta3$, $\theta5$, and $\theta7$ with reference to FIG. 16(b). On this occasion, the local frequency $\omega c$ set by the local frequency setting section 36 is $\omega0+2.5\omega sep$.

In this case, it is necessary to measure across a bandwidth $+3\omega1$ to $+7\omega1$ with the local frequency $\omega c$ as the center. Therefore, the frequency bandwidth BW to which the A/D converter 32 can adapt is to be $BW>+7\omega1-3\omega1=4\omega1=2\omega sep$.

It should be noted that when $\theta1$, $\theta2$, $\theta3$, $\theta4$, $\theta5$, $\theta6$, $\theta7$, and $\theta8$ are measured at the same time, it is necessary to measure across a bandwidth from $-7\omega1$ to $+7\omega1$. Therefore, the frequency bandwidth BW to which the A/D converter 32 can adapt is to be $BW>+7\omega1-(-7\omega1)=14\omega1=7\omega sep$.

Consequently, if $\theta1$ and $\theta2$ are determined, $\theta2$, $\theta4$, and $\theta6$ are then determined, $\theta4$, $\theta6$, and $\theta8$ are then determined, $\theta1$, $\theta3$, and $\theta5$ are then determined, and $\theta3$, $\theta5$, and $\theta7$ are finally determined as in the fourth embodiment, since it is necessary that $BW>2\omega sep$, $\omega sep$ can be larger if BW is constant.

The 90-degree phase shifter 38, the phase acquisition section 40, the match time/phase measurement section 50, the distortion component phase measurement section 60, the display section 70, and the common reference signal source 80 are the same as the third embodiment, and a description thereof, therefore is omitted. It should be noted that a description will later be given of the match time measurement section 54 of the match time/phase measurement section 50.

The phase change quantity acquisition section 90 acquires a phase change quantity of the highest frequency component $\theta 1$ or the lowest frequency component $\theta 2$ of the input frequency components which have changed when the phase acquisition section 40 changes the components for which the phases are acquired to those for $\theta 2$, $\theta 4$, and $\theta 6$ or $\theta 1$, $\theta 3$, and $\theta 5$. This is the same as that of the third embodiment.

Moreover, the phase change quantity acquisition section 90 acquires a phase change quantity of the phase $\theta 4$ of the distortion component which has changed when the phase acquisition section 40 changes the components for which the phases are acquired to $\theta 4$, $\theta 6$, and $\theta 8$.

Specifically, when the phase acquisition section 40 changes components to those for which $\theta 2$, $\theta 4$, and $\theta 6$ are acquired, the phase change quantity acquisition section 90 acquires $\theta 4(T1)$ from the phase acquisition section 40.

Then, when the phase acquisition section 40 changes components to those for which $\theta 4$, $\theta 6$, and $\theta 8$ are acquired, the phase change quantity acquisition section 90 acquires $\theta 4(T3)$ from the phase acquisition section 40. It should be noted that T3 is such a value that $\theta 4(T1)=\theta 4(T3)$. However, when the phase acquisition section 40 changes components for which phases are acquired, there is generated an error, and $\theta 4(T)=\theta 4(T3)$ thus does not hold. If the error is denoted as $\Delta\theta 4$, $\theta 4(T3)=\theta 4(T1)+\Delta\theta 4$. Thus, $\Delta\theta 4$ is obtained as $\Delta\theta 4=\theta 4(T3)-\theta 4(T1)$, and is fed to the match time measurement section 54 and the distortion component phase compensation section 92.

Moreover, the phase change quantity acquisition section 90 acquires a phase change quantity of the phase $\theta 3$ of the distortion component which has changed when the phase acquisition section 40 changes the components for which the phases are acquired to $\theta 3$, $\theta 5$, and $\theta 7$.

Specifically, when the phase acquisition section 40 changes components to those for which $\theta 1$, $\theta 3$, and $\theta 5$ are acquired, the phase change quantity acquisition section 90 acquires $\theta 3(T2)$ from the phase acquisition section 40.

Then, when the phase acquisition section 40 changes components to those for which $\theta 3$, $\theta 5$, and $\theta 7$ are acquired, the phase change quantity acquisition section 90 acquires $\theta 3(T4)$ from the phase acquisition section 40. It should be noted that T4 is such a value that $\theta 3(T4)=\theta 3(T2)$. However, when the phase acquisition section 40 changes components for which phases are acquired, there is generated an error, and $\theta 3(T4)=\theta 3(T2)$ thus does not hold. If the error is denoted as $\Delta\theta 3$, $\theta 3(T4)=\theta 3(T2)+\Delta\theta 3$. Thus, $\Delta\theta 3$ is obtained as $\Delta\theta 3=\theta 3(T4)-\theta 3(T2)$, and is fed to the match time measurement section 54 and the distortion component phase compensation section 92.

The match time measurement section 54 acquires the errors $\Delta\theta 1$ and $\Delta\theta 2$ from the phase change quantity acquisition section 90, and corrects $\theta 2$ while the local frequency $\omega c$ is $\omega 0-1.5\omega sep$, and $\theta 1$ while the local frequency $\omega c$ is $\omega 0+1.5\omega sep$. Namely, the errors $\Delta\theta 2$ and $\Delta\theta 1$ are subtracted. There is then measured a time point $\Delta t$ when $\theta 2$ and $\theta 1$ from which the errors $\Delta\theta 1$ and $\Delta\theta 2$ are respectively subtracted match $\theta 1(\Delta t)$.

Moreover, the match time measurement section 54 acquires the errors $\Delta\theta 3$ and $\Delta\theta 4$ from the phase change quantity acquisition section 90, and corrects $\theta 4$ while the local frequency $\omega c$ is $\omega 0-2.5\omega sep$, and $\theta 3$ while the local frequency $\omega c$ is $\omega 0+2.5\omega sep$. Namely, the errors $\Delta\theta 4$ and $\Delta\theta 3$ are subtracted. Moreover, the match time measurement section 54 acquires the phases $\Delta\theta 4$ and $\Delta\theta 3$ at the match time $\Delta t$ from the distortion component phase measurement section 60.

The match time measurement section 54 then measures the time point $\Delta t$ when the value obtained by subtracting the error $\Delta\theta 4$ from $\theta 4$ matches the phase $\theta 4$ at the match time $\Delta t$ while the local frequency $\omega c$ is $0-2.5\omega sep$. The match time measurement section 54 then measures the time point $\Delta t$ when the value obtained by subtracting the error $\Delta\theta 3$ from $\theta 3$ matches the phase $\theta 3$ at the match time $\Delta t$ while the local frequency $\omega c$ is $\omega 0+2.5\omega sep$.

The distortion component phase compensation section 92 receives $\theta 4$ and $\theta 6$, and $\theta 3$ and $\theta 5$ from the phase determination section 48. Then, the distortion component phase compensation section 92 subtracts the error $\Delta\theta 2$ from $\theta 4$ and $\theta 6$, and subtracts the error $\Delta\theta 1$ from $\theta 3$ and $\theta 5$, and supplies the distortion component phase measurement section 60 with the results.

Moreover, the distortion component phase compensation section 92 receives $\theta 4$, $\theta 6$, and $\theta 8$, and $\theta 3$, $\theta 5$, and $\theta 7$ from the phase determination section 48. The distortion component phase compensation section 92 then subtracts the error $\Delta\theta 4$ from $\theta 4$, $\theta 6$, and $\theta 8$, and subtracts the error $\Delta\theta 3$ from $\theta 3$, $\theta 5$, and $\theta 7$, and supplies the distortion component phase measurement section 60 with the results.

The distortion component phase measurement section 60 measures the phases $\theta 4$, $\theta 6$, and $\theta 8$, and $\theta 3$, $\theta 5$, and $\theta 7$ of the distortion components at the match time point $\Delta t$ based upon the acquisition result of the phase acquisition section 40.

A description will now be given of an operation of the fourth embodiment.

First, the signal of the frequency $\omega 10$ output from the first oscillator 12, and the signal of the frequency $\omega 20$ output from the second oscillator 14 are added by the adder 16, and is fed as the input signal to the amplifier 20. The frequency spectrum of the input signal is as shown in FIG. 2(*a*).

The input signal is amplified by the amplifier 20. It should be noted that the amplifier 20 is a type of non-linear circuits, and thus outputs the distortion components (such as components with the frequency $\omega 30$ and the frequency $\omega 40$) in addition to the components with the frequency $\omega 10$ and the frequency $\omega 20$ (refer to FIG. 2(*b*)).

The output from the amplifier 20 is fed to the phase measurement device 1. The phase measurement device 1 serves to measure the output from the amplifier 20.

First, the output from the amplifier 20 is orthogonally transformed by means of the local frequency $\omega c$ by the multipliers 34*a* and 34*b*. The local frequency setting section 36 sets the local frequency $\omega c$ to $\omega 0$. The local frequency setting section 36 then sets the local frequency $\omega c$ to $\omega 0-1.5\omega sep$, and then to $\omega 0-2.5\omega sep$. The local frequency setting section 36 then sets the local frequency $\omega c$ to $\omega 0+1.5\omega sep$, and finally to $\omega 0+2.5\omega sep$.

The outputs from the multiplier 34*a* and the multiplier 34*b* are fed to the complex FFT section 46. The complex FFT section 46 carries out the complex fast Fourier transform, and acquires the complex vectors for the input frequency components ($\pm\omega 1$) and the distortion components (such as $+3\omega 1$). The phase determination section 48 receives the complex vectors, and determines the phases of the respective components.

The phase change quantity acquisition section 90 acquires $\theta 1(0)$, $\theta 2(0)$, $\theta 2(T1)$, and $\theta 1(T2)$ from the phase determination section 48. The phase change quantity acquisition section 90 obtains $\Delta\theta 2$ while the error $\Delta\theta 2=\theta 2(T1)-\theta 2(0)$, and $\Delta\theta 1$ while the error $\Delta\theta 1=\theta 1(T2)-\theta 1(0)$. The errors $\Delta\theta 1$ and $\Delta\theta 2$ are fed to the match time measurement section 54.

Alternatively, the phase change quantity acquisition section 90 acquires the errors $\Delta\theta 3$ and $\Delta\theta 4$, and supplies the match time measurement section 54 with them.

The match time/phase measurement section 50 receives the phase $\theta 1$ of the input frequency component $+\omega 1$ and the phase $\theta 2$ of the input frequency component $-\omega 1$ of the outputs from the phase determination section 48, and measures the match time point Δt which θ1 and θ2 match each other for the first time, and the phase θ1(Δt) (=θ2(Δt)) thereat.

It should be noted that the match time measurement section 54 corrects θ2 while the local frequency ωc is ω0−1.5ωsep, and θ1 while the local frequency ωc is ω0+1.5ωsep by means of the errors Δθ1 and Δθ2 supplied from the phase change quantity acquisition section 90. Namely, the errors Δθ2 and Δθ1 are subtracted.

The match time measurement section 54 then measures the time point Δt when the value obtained by subtracting the error Δθ4 from θ4 matches the phase θ4 at the match time Δt while the local frequency ωc is 0−2.5ωsep. The match time measurement section 54 then measures the time point Δt when the value obtained by subtracting the error Δθ3 from θ3 matches the phase θ3 at the match time Δt while the local frequency ωc is 0+2.5ωsep.

The distortion component phase compensation section 92 receives the phase θ3 of the distortion component +3ω1 and the like of the outputs from the phase determination section 48. The distortion component phase compensation section 92 is supplied with the errors Δθ1 and Δθ2 from the phase change quantity acquisition section 90. The distortion component phase compensation section 92 subtracts the error Δθ2 from θ4 and θ6 (when θ2, θ4, and θ6 are measured), and subtracts the error Δθ1 from θ3 and θ5 (when θ1, θ3, and θ5 are measured), and supplies the distortion component phase measurement section 60 with the results. Alternatively, the distortion component phase compensation section 92 subtracts the error Δθ4 from θ4, θ6, and θ8 (when θ4, θ6, and θ8 are measured), and subtracts the error Δθ3 from θ3, θ5, and θ7 (when θ3, θ5, and θ7 are measured), and supplies the distortion component phase measurement section 60 with the results.

Moreover, the distortion component phase measurement section 60 receives the match time point Δt from the match time/phase measurement section 50, and measures the phase θ3(Δt) of the distortion component +3 ω1 at the match time point Δt and the like.

The display section 70 displays the measurement result θ1(Δt) by the match time/phase measurement section 50, and the measurement result θ3(Δt) and the like by the distortion component phase measurement section 60.

According to the fourth embodiment, there are obtained the same effects as in the third embodiment.

Moreover, according to the fourth embodiment, it is possible to measure the phases of the seventh distortions (θ7 and θ8). It should be noted that the phases of seventh and higher (such as ninth and eleventh) distortions can be similarly measured according to the fourth embodiment. A description will now be given of measurement of the phases of ninth distortion components and eleventh distortion components as an example.

It is assumed that the phase of a high frequency distortion component of the ninth distortion is denoted as θ9, and the phase of a high frequency distortion component of the eleventh distortion is denoted as θ11. The phase θ7 of the high frequency distortion component of the seventh distortion is determined based upon the measurement result of θ3, θ5, and θ7 (refer to FIG. 16(b)). Similarly, the phase θ9 is determined based upon the measurement result of θ5, θ7, and θ9, and the phase θ11 is determined based upon the measurement result of θ7, θ9, and θ11.

Moreover, it is assumed that the phase of a low frequency distortion component of the ninth distortion is denoted as θ10, and the phase of a low frequency distortion component of the eleventh distortion is denoted as θ12. The phase θ8 of the low frequency distortion component of the seventh distortion is determined based upon the measurement result of θ4, θ6, and θ8 (refer to FIG. 15(c)). Similarly, the phase θ10 is determined based upon the measurement result of θ6, θ8, and θ10, and the phase θ12 is determined based upon the measurement result of θ8, θ10, and θ12.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the match time/phase measurement section 50 and the distortion component phase measurement section 60), thereby installing the program on the hard disk. This method may also realize the above-described embodiments.

The invention claimed is:

1. A phase measurement device that measures an output from a circuit to be measured upon feeding an input signal having at least two input frequency components to the circuit to be measured, comprising:
a phase acquisition section that acquires phases of the input frequency components and a distortion component based upon a local frequency;
a match time measurer that measures a match time at which the phases of the input frequency components match each other based upon an acquired result of said phase acquisition section; and
a distortion component phase measurer that measures a phase of the distortion component at the match time based upon an acquired result of said phase acquisition section,
wherein the distortion component includes at least either of a high frequency distortion component that has a frequency higher than the input frequency components, and a low frequency distortion component that has a frequency lower than the input frequency components, and
said phase acquisition section acquires both or either of a highest frequency component and a lowest frequency component of the input frequency components, and a phase of the high frequency distortion component or the low frequency distortion component.

2. The phase measurement device according to claim 1, wherein said phase acquisition section comprises:
an orthogonal transformer that orthogonally transforms the output from the circuit to be measured by means of the local frequency; and
a phase acquirer that acquires the phases of the input frequency components and the distortion component in outputs from said orthogonal transformer.

3. The phase measurement device according to claim 2, wherein said phase acquisition section acquires
the phases of the highest frequency component and the lowest frequency component of the input frequency components, and the phase of the low frequency distortion component, and
the phases of the highest frequency component and the lowest frequency component of the input frequency components, and the phase of the high frequency distortion component.

4. The phase measurement device according to claim 3, comprising a local frequency setter that sets the local frequency,
wherein said local frequency setter sets the local frequency both to an average of the lowest frequency of the distortion components and the highest frequency of the input frequency components, and to an average of the highest frequency of the distortion components and the lowest frequency of the input frequency components.

5. The phase measurement device according to claim 2, wherein said phase acquisition section acquires the phases of the lowest frequency component and the highest frequency component of the input frequency components, the phase of the lowest frequency component of the input frequency components and the phase of the low frequency distortion component, and the phase of the highest frequency component of the input frequency components and the phase of the high frequency distortion component.

6. The phase measurement device according to claim 5, comprising a local frequency setter that sets the local frequency, wherein said local frequency setter sets the local frequency to an average of the lowest frequency and the highest frequency of the input frequency components, to an average of the lowest frequency of the distortion component and the lowest frequency of the input frequency component, and to an average of the highest frequency of the distortion component and the highest frequency of the input frequency component.

7. The phase measurement device according to claim 5, comprising:

a phase change quantity acquirer that acquires a phase change quantity of the highest frequency component or the lowest frequency component of the input frequency components which has changed due to a change of the components for which the phase acquisition section acquires the phases each time of the change; and a distortion component phase compensator that corrects the measurement result of said distortion component phase measurer based upon the phase change quantity.

8. The phase measurement device according to claim 2, wherein said phase acquisition section acquires the phases of the highest frequency component and the lowest frequency component of the input frequency components, and the phase of the lowest frequency component of the input frequency components and the phase of a neighboring low frequency distortion component which is a part of the low frequency distortion components, and acquires the phase of a low frequency distortion component whose phase has already been acquired and the phase of a low frequency distortion component whose frequency is lower than that of the low frequency distortion component until the acquisition of the phase of the distortion component at the lowest frequency.

9. The phase measurement device according to claim 2, wherein said phase acquisition section acquires the phases of the highest frequency component and the lowest frequency component of the input frequency components, and the phases of the highest frequency component of the input frequency components, and the phase of a neighboring high frequency distortion component which is a part of the high frequency distortion components, and acquires the phase of a high frequency distortion component whose phase has already been acquired and the phase of a high frequency distortion component whose frequency is higher than that of the high frequency distortion component until the acquisition of the phase of the distortion component at the highest frequency.

10. The phase measurement device according to claim 8, comprising a local frequency setter that sets the local frequency, wherein, upon the phase acquisition, said local frequency setter sets the local frequency to an average value of the maximum value and the minimum value of the frequency of the signals for which the phases are acquired.

11. The phase measurement device according to claim 8, comprising:

a phase change quantity acquirer that acquires a phase change quantity of a distortion component which has changed due to a change of the components for which the phase acquisition section acquires the phases each time of the change; and a distortion component phase compensator that corrects the measurement result of said distortion component phase measurer based upon the phase change quantity.

12. The phase measurement device according to claim 1, wherein said phase acquisition section comprises a discrete Fourier transformer that carries out discrete Fourier transform.

13. The phase measurement device according to claim 1, comprising a display that displays a vector whose angle is the phase of the distortion component, and whose length is the amplitude of the distortion component.

14. The phase measurement device according to claim 13, wherein said display means displays a vector whose length is a logarithm of the amplitude of the distortion component.

15. The phase measurement device according to claim 6, comprising:

a phase change quantity acquirer that acquires a phase change quantity of the highest frequency component or the lowest frequency component of the input frequency components which has changed due to a change of the components for which the phase acquisition section acquires the phases each time of the change; and a distortion component phase compensator that corrects the measurement result of said distortion component phase measurer based upon the phase change quantity.

16. The phase measurement device according to claim 9, comprising a local frequency setter that sets the local frequency, wherein, upon the phase acquisition, said local frequency setter sets the local frequency to an average value of the maximum value and the minimum value of the frequency of the signals for which the phases are acquired.

17. The phase measurement device according to claim 9, comprising:

a phase change quantity acquirer that acquires a phase change quantity of a distortion component which has changed due to a change of the components for which the phase acquisition section acquires the phases each time of the change; and a distortion component phase compensator that corrects the measurement result of said distortion component phase measurer based upon the phase change quantity.

18. A phase measurement method of measuring an output from a circuit to be measured upon feeding an input signal having at least two input frequency components to the circuit to be measured, said method comprising:

acquiring phases of the input frequency components and a distortion component based upon a local frequency;

measuring a match time at which the phases of the input frequency components match each other based upon an acquired result of said phase acquisition step; and measuring a phase of the distortion component at the match time based upon an acquired result of said phase acquisition step, wherein the distortion component includes at least either of a high frequency distortion component that has a frequency higher than the input frequency components, and a low frequency distortion component that has a frequency lower than the input frequency components, and said phase acquisition step acquires both or either of a highest frequency component and a lowest frequency component of the input frequency components, and a phase of the high frequency distortion component or the low frequency distortion component.

19. A computer-readable medium having a program of instructions for execution by the computer to perform a phase measurement process of a phase measurement device that measures an output from a circuit to be measured upon feeding an input signal having at least two input frequency components to the circuit to be measured, having a phase acquisition section that acquires phases of the input frequency components and a distortion component based upon a local frequency, said phase measurement process comprising:

measuring a match time at which the phases of the input frequency components match each other based upon an acquired result of said phase acquisition section; and measuring a phase of the distortion component at the match time based upon an acquired result of said phase acquisition section, wherein the distortion component includes at least either of a high frequency distortion component that has a frequency higher than the input frequency components, and a low frequency distortion component that has a frequency lower than the input frequency components, and said phase acquisition section acquires both or either of a highest frequency component and a lowest frequency component of the input frequency components, and a phase of the high frequency distortion component or the low frequency distortion component.

a distortion component phase compensator that corrects the measurement result of said distortion component phase measurer based upon the phase change quantity.

* * * * *

UNITED STATES PATENT AND TRADEMARK OFFICE
CERTIFICATE OF CORRECTION

| | |
|---|---|
| PATENT NO. | : 7,466,141 B2 |
| APPLICATION NO. | : 10/597415 |
| DATED | : December 16, 2008 |
| INVENTOR(S) | : Kurosawa et al. |

Page 1 of 1

It is certified that error appears in the above-identified patent and that said Letters Patent is hereby corrected as shown below:

At column 24, line 30 (claim 14, line 2) of the printed patent, "means" should be deleted.

At column 26, line 19 (claim 19, line 26) of the printed patent, "a distortion component phase compensator that corrects the measurement result of said distortion component phase measurer based upon the phase change quantity." should be deleted.

Signed and Sealed this

Fourteenth Day of July, 2009

JOHN DOLL
*Acting Director of the United States Patent and Trademark Office*